(12) United States Patent
Takeda

(10) Patent No.: US 8,427,568 B2
(45) Date of Patent: Apr. 23, 2013

(54) SOLID-STATE IMAGE PICKUP DEVICE, METHOD FOR MANUFACTURING THE SAME, AND ELECTRONIC APPARATUS

(75) Inventor: Takeshi Takeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 266 days.

(21) Appl. No.: 12/881,687

(22) Filed: Sep. 14, 2010

(65) Prior Publication Data

US 2011/0074969 A1   Mar. 31, 2011

(30) Foreign Application Priority Data

Sep. 28, 2009  (JP) .................. 2009-223233

(51) Int. Cl.
- *H04N 3/14* (2006.01)
- *H04N 9/64* (2006.01)
- *H01L 31/062* (2006.01)
- *H01L 27/148* (2006.01)
- *H01L 21/00* (2006.01)

(52) U.S. Cl.
USPC ........... 348/311; 348/297; 348/298; 348/249; 257/291; 257/292; 257/215; 438/75; 438/60; 438/90

(58) Field of Classification Search ................. 348/311, 348/249, 282, 281, 297, 298, 302, 303, 306, 348/313, 314, 316, 222.1, 308; 257/214, 257/215, 238, 291, 292, 233, 294, 222, 194; 438/75, 60, 90, 144, 53; 250/208.1
See application file for complete search history.

(56) References Cited

U.S. PATENT DOCUMENTS

2007/0019092 A1* 1/2007 Oda ............................. 348/311
2007/0064137 A1* 3/2007 Kanbe ......................... 348/311
2007/0064139 A1* 3/2007 Nagase et al. ............... 348/311

FOREIGN PATENT DOCUMENTS

JP   2004-165462   6/2004

* cited by examiner

*Primary Examiner* — Nhan T Tran
*Assistant Examiner* — Marly Camargo
(74) *Attorney, Agent, or Firm* — SNR Denton US LLP

(57) ABSTRACT

Disclosed herein is a solid-state image pickup device, including a pixel, the pixel including: a light receiving section; a charge transfer path; a transfer electrode; a readout gate section; and a readout electrode.

12 Claims, 28 Drawing Sheets a-a' a-a' a-a' a-a' a-a' a-a' a-a' a-a' a-a'

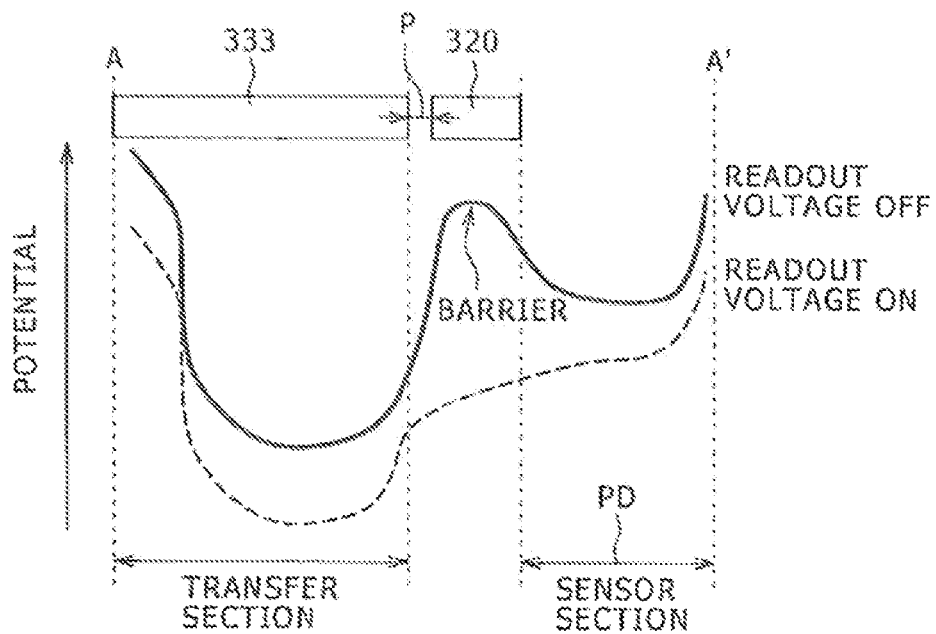
PRIOR ART FIG. 29A
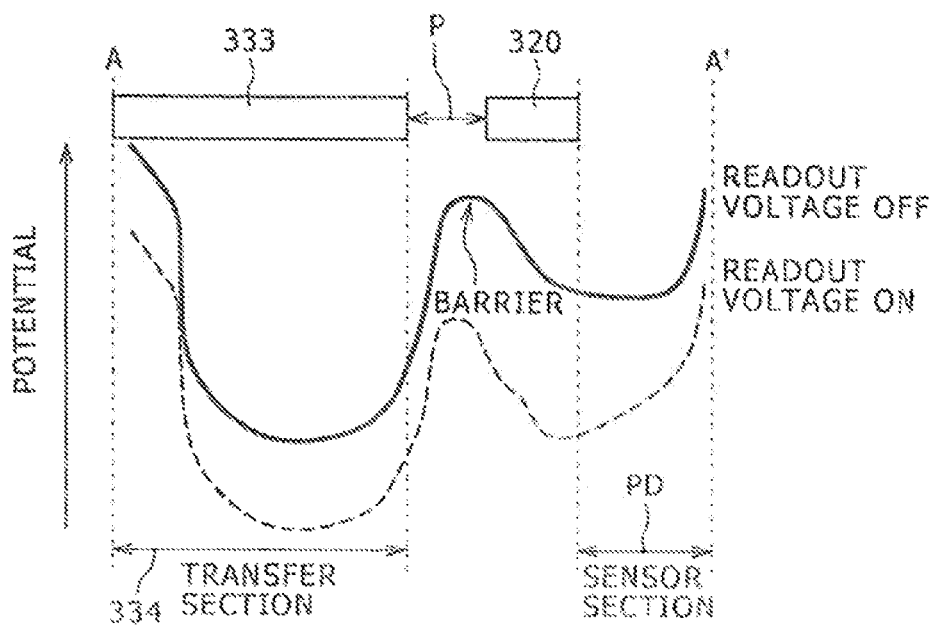
PRIOR ART FIG. 29B

SOLID-STATE IMAGE PICKUP DEVICE, METHOD FOR MANUFACTURING THE SAME, AND ELECTRONIC APPARATUS

BACKGROUND OF THE INVENTION

1. Field of the Invention

The present invention relates to a solid-state image pickup device, a method for manufacturing the solid-state image pickup device, and an electronic apparatus using the solid-state image pickup device.

2. Description of the Related Art

A CCD (Charge Coupled Device) type solid-state image pickup device used in an area sensor, a digital still camera or the like has a light receiving section for generating and accumulating a signal charge according to incident light and a charge transfer section for transferring the signal charge from the light receiving section. The charge transfer section has a CCD structure. The charge transfer section includes a charge transfer path formed in a semiconductor substrate and a plurality of transfer electrodes disposed so as to be adjacent to each other above the charge transfer path. The charge transfer section transfers the signal charge read out from the light receiving section by sequentially driving the plurality of transfer electrodes.

In the CCD type solid-state image pickup device, when light is made directly incident on a part under the transfer electrodes, the light becomes a so-called smear, and produces a pseudo image in an image. In order to suppress such a phenomenon, in an IT (Interline Transfer) type CCD solid-state image pickup device, a light shielding film of a material that blocks light is generally formed on transfer electrodes.

A metallic material is generally used as the material for the light shielding film. In addition, using a part of the light shielding film as a readout electrode used to read out the signal charge accumulated in the light receiving section to the charge transfer path at the same time has been proposed. An existing solid-state image pickup device using a light shielding film as a readout electrode will be described below.

FIG. 28 is a schematic sectional configuration diagram of an existing CCD type solid-state image pickup device. The existing CCD type solid-state image pickup device includes a light receiving section PD, a charge transfer path 305 formed so as to be adjacent to the light receiving section PD, a light shielding film 322 for shielding regions excluding the light receiving section PD from light, a readout electrode 320, and a transfer electrode 333. The existing CCD type solid-state image pickup device also includes a color filter layer 325 and an on-chip lens layer 326 formed on a light incidence side.

The light receiving section PD is formed on the light incidence side of a substrate 300 made of an n-type semiconductor substrate, for example. The light receiving section PD mainly includes a dark current suppressing region 302 made of a p-type high-concentration impurity region formed in the surface of the substrate and a charge accumulating region 301 made of an n-type impurity region formed under the dark current suppressing region 302. In the light receiving section PD, a main photodiode is formed by a pn junction between the dark current suppressing region 302 and the charge accumulating region 301.

The charge transfer path 305 is formed by an n-type impurity region adjacent to one side of the light receiving section PD in the substrate 300. In addition, a well region 304 made of a p-type high-concentration impurity region is formed under the charge transfer path 305.

The transfer electrode 333 is formed on the charge transfer path 305 with a gate insulating film interposed between the transfer electrode 333 and the charge transfer path 305. In actuality, a plurality of transfer electrodes 333 are formed in a vertical direction over the charge transfer path 305. The charge transfer path 305 and the transfer electrode 333 form a vertical transfer register of a CCD structure. The vertical transfer register reads out a signal charge generated and accumulated in the light receiving section PD to the inside of the charge transfer path 305, and thereafter transfers the signal charge read out to the charge transfer path 305 in the vertical direction by sequentially driving the plurality of transfer electrodes 333.

The light receiving section PD and the vertical transfer register adjacent to the light receiving section PD form a pixel. Each pixel is separated by an element isolation region 303 made of a p-type high-concentration impurity region formed in the substrate 300.

The light shielding film 322 is formed of a metallic material made of aluminum (Al), for example. The light shielding film 322 is formed over the transfer electrode 333 formed on the substrate 300 with an interlayer insulating film 311 interposed between the light shielding film 322 and the transfer electrode 333. The light shielding film 322 has an overhang part 321 formed to prevent the occurrence of a smear in the charge transfer path 305 due to light incident from an edge of the light shielding film 322.

A plasma SiN film 323 is formed on the entire surface of the substrate 300 including the light shielding film 322. A planarizing film 324 is formed on the plasma SiN film 323. A color filter layer 325 of R (red), G (green), and B (blue) is formed for each pixel on the planarizing film 324. An on-chip lens layer 326 is formed at a position corresponding to the light receiving section PD of each pixel on the color filter layer 325.

In the existing solid-state image pickup device, the overhang part 321 formed by making an edge part of the light shielding film 322 overhang to a position above a readout gate section formed between the light receiving section PD and the charge transfer path 305 is formed so as to serve also as the readout electrode 320 for an operation of reading out a signal charge.

In the solid-state image pickup device having the above-described configuration, a signal charge generated and accumulated in the light receiving section PD is read out to the charge transfer path 305 via the readout gate section by applying a readout voltage to the light shielding film 322. Then, the read-out signal charge is transferred in the vertical direction by sequentially applying a transfer voltage to the transfer electrodes 333.

In such a structure of the existing solid-state image pickup device, the light shielding film 322 can serve also as the readout electrode. It is therefore possible to increase the area of the light receiving section PD as compared with a structure retaining the light shielding film 322 and the readout electrode 320 separately from each other, and take light into the light receiving section PD more easily.

As shown in FIG. 28, when the light shielding film 322 is used as the readout electrode, the transfer electrode 333 and the readout electrode are formed by separate processes, and positional relation between the transfer electrode 333 and the readout electrode is determined by the film thickness P of the interlayer insulating film 311 formed between the transfer electrode 333 and the readout electrode. Thus, when the film thickness P of the interlayer insulating film 311 is changed, positional relation between the readout electrode 320 and a potential barrier formed between the light receiving section PD and the charge transfer path 305 within the substrate 300 is shifted.

FIGS. 29A and 29B show a potential configuration within the substrate 300 along a line A-A' in FIG. 28.

FIG. 29A is a diagram of potential changes in a case where positional relation between the potential barrier formed between the light receiving section PD and the charge transfer path 305 and the readout electrode 320 is ideally formed. FIG. 29B is a diagram of potential changes in a case where the positional relation between the potential barrier formed between the light receiving section PD and the charge transfer path 305 and the readout electrode 320 is formed in a shifted manner.

As shown in FIG. 29A, in the case where the positional relation between the potential barrier and the readout electrode 320 is formed ideally, when a readout voltage is applied to the readout electrode 320, the voltage of the readout electrode 320 is applied to the whole of the potential barrier. Thus, the barrier can be crushed even with a low voltage, and a signal charge can be read out from the light receiving section PD to the charge transfer path 305 efficiently.

On the other hand, as shown in FIG. 29B, in the case where the positional relation between the potential barrier and the readout electrode 320 is formed in a shifted manner, when a readout voltage is applied to the readout electrode 320, the voltage of the readout electrode 320 is not applied to the whole of the potential barrier. In this case, the application of the same readout voltage as in the case where the potential barrier and the readout electrode 320 are formed ideally as in FIG. 29A cannot crush the barrier, so that the signal charge cannot be read out from the light receiving section PD to the charge transfer path 305. The example shown in FIG. 29B thus needs a high voltage to crush the barrier.

When the readout voltage is set high in consideration of variation in the positional relation between the readout electrode 320 and the potential barrier, the signal charge can be read out from the light receiving section PD to the charge transfer path 305. However, a high readout voltage means a high power consumption. It is thus desirable that the readout voltage be as low as possible.

In general, for the readout electrode 320 formed by the light shielding film 322 in the existing solid-state image pickup device described above, a film of a material having a light shielding property is formed at the time of the formation of the readout electrode 320 and thereafter patterned by a lithography method, and an excess film is removed by a dry etching method. However, in this case, there are level differences at the time of the patterning, thereby resulting in variations in the film thickness of a photoresist used in the lithography method and thus resulting in variations in pattern dimensions. Therefore the width of the readout electrode 320 also varies.

Because variations in the positional relation between the transfer electrode 333 and the readout electrode 320 and variations at the time of the patterning thus interact with each other, it is extremely difficult to control the readout voltage in the existing structure.

[Patent Document 1]
Japanese Patent Laid-Open No. 2004-165462

SUMMARY OF THE INVENTION

In view of the above, an embodiment of the present invention provides a solid-state image pickup device that improves a smear characteristic and which enables readout with a fixed readout voltage at a time of readout of a signal charge.

A solid-state image pickup device according to an embodiment of the present invention includes a pixel, the pixel including a light receiving section, a charge transfer path, a transfer electrode, a readout gate section, and a readout electrode. The light receiving section is formed on a light incidence side of a substrate. The light receiving section generates and accumulates a signal charge corresponding to an amount of incident light. The charge transfer path is formed on one side of the light receiving section. The charge transfer path transfers the signal charge read out from the light receiving section. The transfer electrode is formed by a light shielding material above the substrate in which the charge transfer path is formed, to transfer the signal charge within the charge transfer path. The readout gate section is formed between the light receiving section and the charge transfer path. The readout gate section performs an operation of reading out the signal charge formed in the light receiving section. The readout electrode is formed by a light shielding material above the substrate in which the readout gate section is formed, to make the readout gate section perform the readout operation. The readout electrode is formed independently of the transfer electrode in a same single layer as the transfer electrode.

In the solid-state image pickup device according to the above-described embodiment of the present invention, the readout electrode is formed independently of the transfer electrode in a same single layer as the transfer electrode. Because the readout electrode and the transfer electrode are formed independently of each other, high voltage is not applied to the transfer electrode at the time of application of a readout voltage to the readout electrode. In addition, because the readout electrode and the transfer electrode are formed in the same single layer, positional relation between the readout electrode and the transfer electrode is formed with high precision.

A method for manufacturing a solid-state image pickup device according to an embodiment of the present invention has the following steps. First, the method has a step of preparing a substrate. In addition, the method has a step of forming a light receiving section for generating and accumulating a signal charge corresponding to incident light and a charge transfer path for transferring the signal charge generated and accumulated in the light receiving section by performing ion implantation of a desired impurity into a desired region of the substrate. In addition, the method has a step of forming a readout electrode for reading out the signal charge of the light receiving section to the charge transfer path and a transfer electrode for transferring the signal charge read out to the charge transfer path independently of each other by one time of patterning in a desired region on the substrate before or after forming the light receiving section and the charge transfer path. In addition, the method has a step of forming a wiring layer electrically connected to the readout electrode via a contact part over the readout electrode and the transfer electrode.

According to the method for manufacturing the solid-state image pickup device according to the above-described embodiment of the present invention, the readout electrode and the transfer electrode are formed by one time of patterning. Thus, the readout electrode and the transfer electrode are positioned with high precision, and the electrode width of the readout electrode is formed with high precision.

An electronic apparatus according to an embodiment of the present invention includes an optical lens, a solid-state image pickup device on which light condensed by the optical lens is made incident, and a signal processing circuit for processing an output signal output by the solid-state image pickup device. The solid-state image pickup device forming the electronic apparatus according to the embodiment of the present invention includes a pixel, the pixel including a light receiving section, a charge transfer path, a transfer electrode, a readout gate section, and a readout electrode. In the solid-state image pickup device, the light receiving section is formed on a light incidence side of a substrate. The light receiving section generates and accumulates a signal charge corresponding to an amount of incident light. The charge transfer path is formed on one side of the light receiving section. The charge transfer path transfers the signal charge read out from the light receiving section. The transfer electrode is formed by a light shielding material above the substrate in which the charge transfer path is formed, to transfer the signal charge within the charge transfer path. The readout gate section is formed between the light receiving section and the charge transfer path. The readout gate section performs an operation of reading out the signal charge formed in the light receiving section. The readout electrode is formed by a light shielding material above the substrate in which the readout gate section is formed, to make the readout gate section perform the readout operation. The readout electrode is formed independently of the transfer electrode in a same single layer as the transfer electrode.

According to the embodiment of the present invention, positional relation between the readout electrode and the transfer electrode can be formed with high precision. Thus, a readout voltage can be made constant, and a solid-state image pickup device improved in smear characteristic can be obtained. In addition, an electronic apparatus improved in image quality is obtained by using the solid-state image pickup device.

BRIEF DESCRIPTION OF THE DRAWINGS

FIGS. 29A and 29B show potential configurations within a substrate 300 along a line A-A' in FIG. 28.

DETAILED DESCRIPTION OF PREFERRED EMBODIMENTS

An example of solid-state image pickup devices, methods for manufacturing the same, and an electronic apparatus according to embodiments of the present invention will hereinafter be described with reference to FIGS. 1 to 27. The embodiments of the present invention will be described in the following order. It is to be noted that the present invention is not limited to the following examples.
1. First Embodiment: Solid-State Image Pickup Device
    1-1 Configuration of Whole of Solid-State Image Pickup Device
    1-2 Configuration of Principal Parts
    1-3 Manufacturing Method
2. Second Embodiment: Solid-State Image Pickup Device
3. Third Embodiment: Solid-State Image Pickup Device
4. Fourth Embodiment: Solid-State Image Pickup Device
5. Fifth Embodiment: Solid-State Image Pickup Device
6. Sixth Embodiment: Solid-State Image Pickup Device
7. Seventh Embodiment: Solid-State Image Pickup Device
8. Eighth Embodiment: Solid-State Image Pickup Device
9. Ninth Embodiment: Solid-State Image Pickup Device
10. Tenth Embodiment: Solid-State Image Pickup Device
11. Eleventh Embodiment: Solid-State Image Pickup Device
12. Twelfth Embodiment: Electronic Apparatus

1. First Embodiment

Solid-State Image Pickup Device

1-1 Configuration of Whole of Solid-State Image Pickup Device

Figure 1:
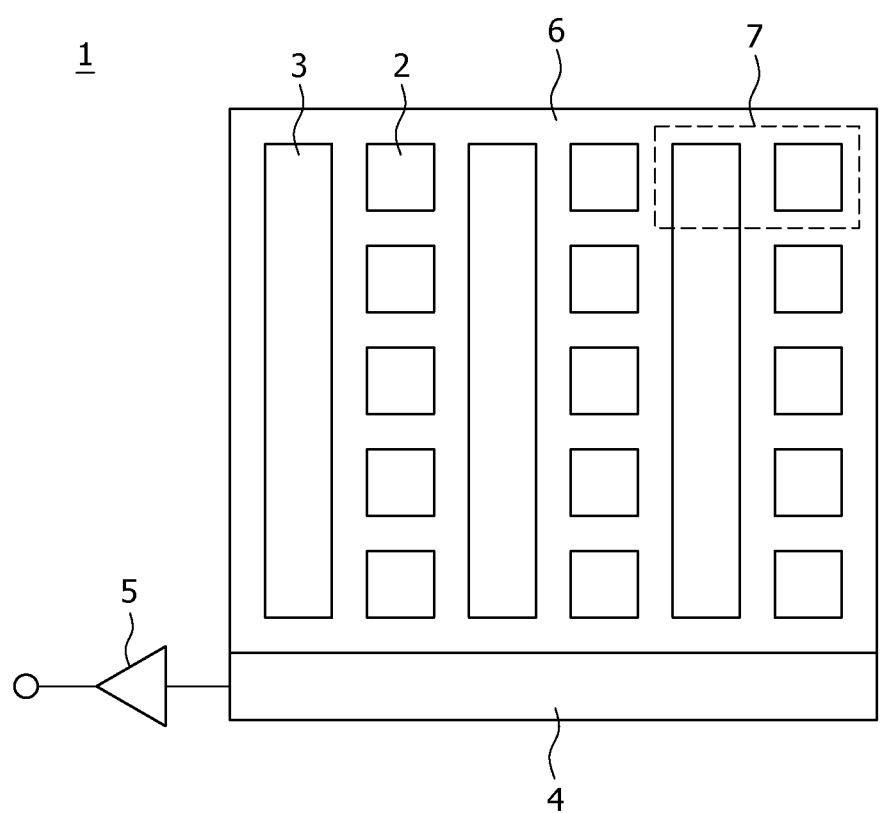
FIG. 1 is a schematic configuration diagram showing the whole of a CCD type solid-state image pickup device according to a first embodiment of the present invention.

FIG. 1 is a schematic configuration diagram of a CCD type solid-state image pickup device according to a first embodiment of the present invention. As shown in FIG. 1, the solid-state image pickup device 1 according to the present embodiment includes a plurality of light receiving sections 2 formed in a substrate 6, vertical transfer registers 3, a horizontal transfer register 4, and an output circuit 5. One light receiving section 2 and a vertical transfer register 3 adjacent to the light receiving section 2 form a unit pixel 7.

The light receiving section 2 is formed by a photoelectric converting element for generating a signal charge corresponding to an amount of received light, that is, a photodiode. The light receiving section 2 generates a signal charge corresponding to an amount of incident light. In the present embodiment, a plurality of light receiving sections 2 are formed in the form of a matrix in a horizontal direction and a vertical direction within a two-dimensional plane of the substrate 6.

The vertical transfer registers 3 have a CCD structure. The plurality of vertical transfer registers 3 are formed in the vertical direction for each of the light receiving sections 2 arranged in the vertical direction. The vertical transfer registers 3 transfer signal charges read from the light receiving sections 2 in the vertical direction.

Transfer stages in which the vertical transfer registers 3 according to the present embodiment are formed are for example configured so as to be four-phase-driven by a transfer driving pulse applied from a transfer driving pulse circuit not shown in the figure.

In a final stage of the vertical transfer registers 3, signal charges retained in the final stage are transferred to the horizontal transfer register 4 by applying the transfer driving pulse.

The horizontal transfer register 4 has a CCD structure. The horizontal transfer register 4 is formed at one end of the final stage of the vertical transfer registers 3. Transfer stages in which the horizontal transfer register 4 is formed transfer the signal charges vertically transferred by the vertical transfer registers 3 for each horizontal line in the horizontal direction.

The output circuit 5 subjects the signal charges horizontally transferred by the horizontal transfer register 4 to charge-to-voltage conversion, and thereby outputs the signal charges as a video signal.

In the solid-state image pickup device 1 having the above-described constitution, signal charges accumulated in the light receiving sections 2 are transferred in the vertical direction by the vertical transfer registers 3, and transferred to the inside of the horizontal transfer register 4. Then, the signal charges transferred to the inside of the horizontal transfer register 4, that is, the signal charges within the horizontal transfer register 4 are each transferred in the horizontal direction, and output as a video signal via the output circuit 5.

1-2 Configuration of Principal Parts

Figure 2A:
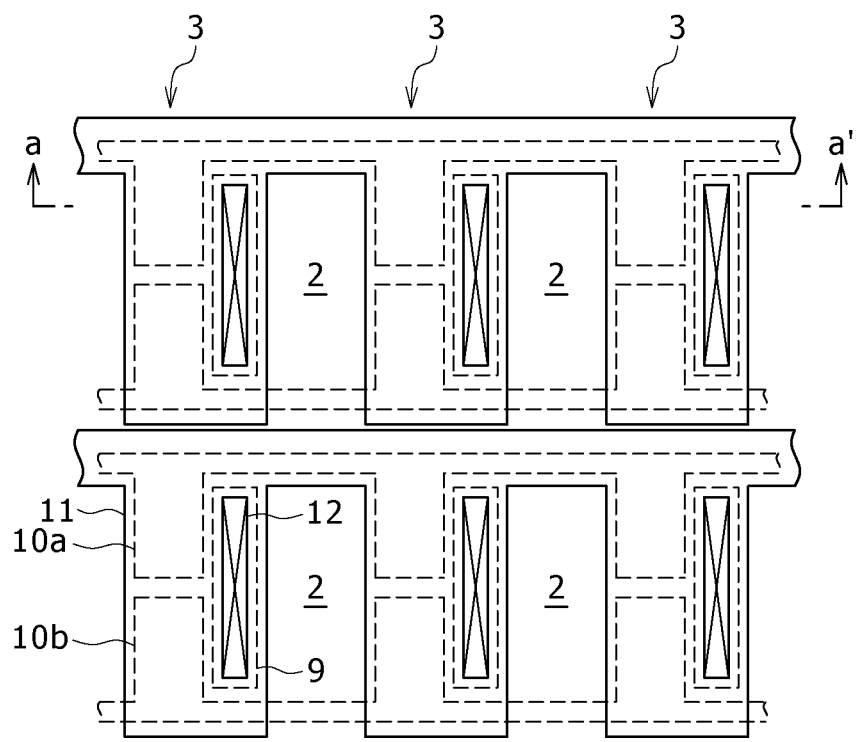
FIGS. 2A and 2B are a schematic plan configuration diagram of principal parts of the solid-state image pickup device in the example of the first embodiment and a sectional configuration diagram taken along a line a-a' in FIG. 2A.
Figure 2B:
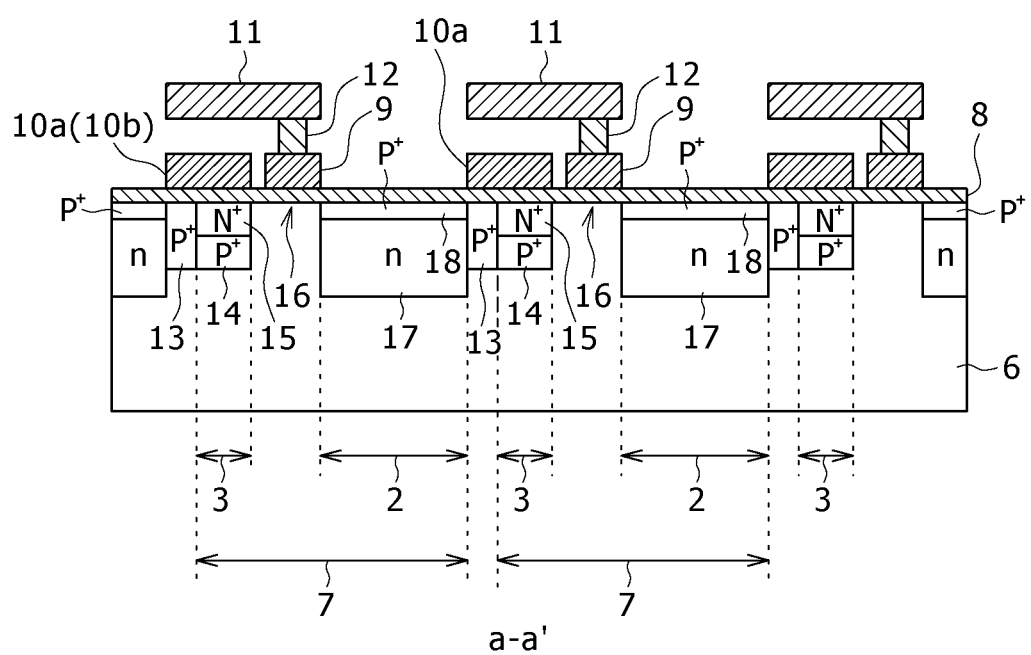

FIG. 2A shows a schematic plan configuration of principal parts of the solid-state image pickup device 1 in the example of the present embodiment. FIG. 2B shows a schematic sectional configuration along a line a-a' in FIG. 2A. FIGS. 2A and 2B show a plan configuration of four pixels.

A pixel 7 in the solid-state image pickup device 1 in the example of the present embodiment includes a light receiving section 2, a charge transfer path 15, and a readout gate section 16 formed in the substrate 6 as well as a first transfer electrode 10a, a second transfer electrode 10b, and a readout electrode 9 formed on the substrate 6. In addition, a wiring layer 11 is formed over the first transfer electrode 10a, the second transfer electrode 10b, and the readout electrode 9.

Figure 3A:
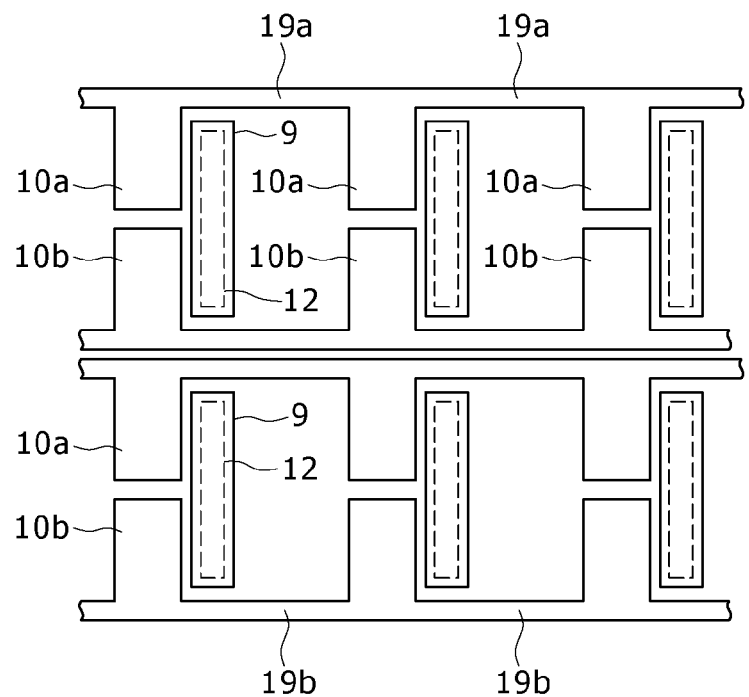
FIGS. 3A and 3B are a plan configuration diagram of only a first transfer electrode, a second transfer electrode, and a readout electrode and a plan configuration diagram of only a wiring layer.
Figure 3B:
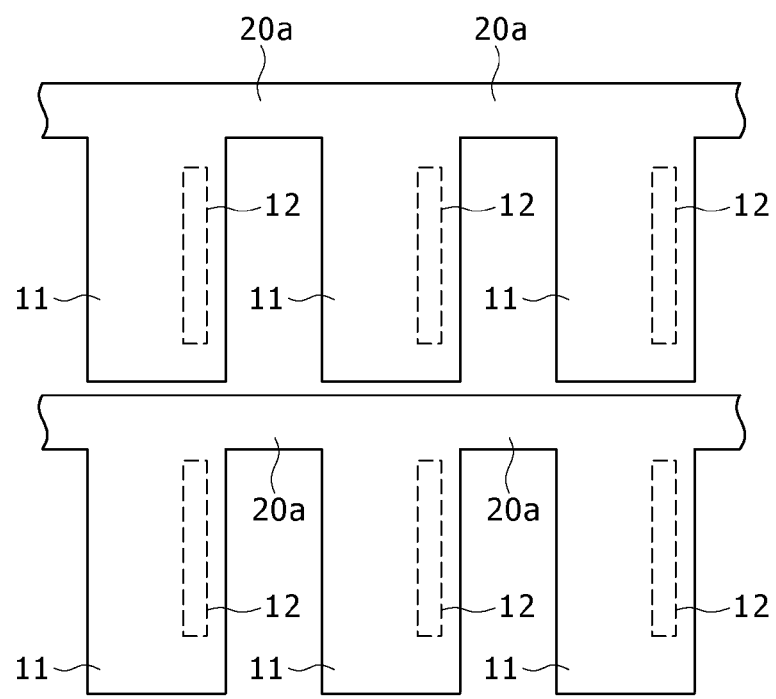

FIG. 3A shows a plan configuration of only the first transfer electrode 10a, the second transfer electrode 10b, and the readout electrode 9. FIG. 3B shows a plan configuration of only the wiring layer.

In the following, the configuration of the pixel 7 will be described in detail with reference to FIGS. 2A and 2B and FIGS. 3A and 3B.

As shown in FIG. 2A, the substrate 6 is formed by a semiconductor substrate of a first conductivity type (n-type in the example of the present embodiment).

The light receiving section 2 includes a dark current suppressing region 18 formed by a high-concentration impurity region of a second conductivity type (p-type in the example of the present embodiment) which region is formed in a top surface on a light incidence side of the substrate 6 and a charge accumulating region 17 formed by an n-type impurity region formed in contact with the lower part of the dark current suppressing region 18. In the light receiving section 2, a pn junction formed between the dark current suppressing region 18 and the charge accumulating region 17 constitutes a main photodiode. A signal charge generated by photoelectric conversion of light incident on the light receiving section 2 is accumulated in the charge accumulating region 17. In addition, a dark current occurring at the interface of the substrate 6 is suppressed by the dark current suppressing region 18 by being captured by holes as majority carriers in the dark current suppressing region 18.

The charge transfer path 15 is formed by an n-type high-concentration impurity region formed on a substrate 6 surface side as one side of the light receiving section 2. The charge transfer path 15 is formed in one line for each light receiving section 2 formed in the vertical direction. A well region 14 made of a p-type high-concentration impurity region is formed under the charge transfer path 15 made of the n-type high-concentration impurity region.

The readout gate section 16 is formed between the light receiving section 2 and the charge transfer path 15. The readout gate section 16 is formed by an n-type region forming the substrate 6. The readout gate section 16 performs a readout operation for reading out a signal charge accumulated in the light receiving section 2 to the charge transfer path 15. Pixels 7 adjacent to each other are electrically isolated from each other by an element isolation region 13 formed by a p-type high-concentration impurity region on the surface side of the substrate 6.

As shown in FIG. 2B, the first transfer electrode 10a and the second transfer electrode 10b are formed on the charge transfer path 15 formed in the substrate 6 with an insulating film 8 formed of a silicon oxide film, for example, interposed between the first transfer electrode 10a and the second transfer electrode 10b and the charge transfer path 15. In addition, as shown in FIG. 2A and FIG. 3A, the first transfer electrode 10a and the second transfer electrode 10b are formed in order in the vertical direction along the charge transfer path 15. The first transfer electrode 10a is connected to a first transfer electrode 10a forming a pixel 7 in the same row by a wiring section 19a. Similarly, the second transfer electrode 10b is connected to a second transfer electrode 10b forming the pixel 7 in the same row by a wiring section 19b. The charge transfer path 15, the first transfer electrode 10a, and the second transfer electrode 10b of such a configuration form a vertical transfer register 3 of a CCD structure.

The readout electrode 9 is formed on the readout gate section 16 formed in the substrate 6 with the insulating film 8 formed of a silicon oxide film interposed between the readout electrode 9 and the readout gate section 16. As shown in FIG. 3A, the readout electrode 9 is formed independently of the first transfer electrode 10a and the second transfer electrode 10b, and is formed in the same single layer as the first transfer electrode 10a and the second transfer electrode 10b. As shown in FIG. 2A and FIG. 2B, the readout electrode 9 is connected to the wiring layer 11 formed over the readout electrode 9 via a contact part 12.

The first transfer electrode 10a, the second transfer electrode 10b, and the readout electrode 9 formed independently of each other in the same single layer are formed by an electrode material having a light shielding property. Applicable as the electrode material are for example W (tungsten), Ti (titanium), Cu (copper), and Ta (tantalum), compounds thereof, and oxides, nitrides, or silicides thereof.

As will be described later, the first transfer electrode 10a, the second transfer electrode 10b, and the readout electrode 9 formed in the same single layer are each formed with the positional relation, width and the like thereof determined by same patterning.

As shown in FIG. 2A and FIG. 2B, the wiring layer 11 is formed over the first transfer electrode 10a, the second transfer electrode 10b, and the readout electrode 9 via an interlayer insulating film not shown in the figure, and is connected to the readout electrode 9 via the contact part 12. In addition, as shown in FIG. 3B, the wiring layer 11 is formed for each pixel 7, and respective wiring layers 11 forming pixels 7 in the same row are connected to each other by wiring parts 20a. The wiring layer 11 is formed by a wiring material having a light shielding property. The contact part 12 is formed by embedding for example tungsten in a contact hole formed in the interlayer insulating film.

The wiring layer 11 of such a configuration is used as wiring for supplying a desired readout voltage to the readout electrode 9, and is also used as a light shielding film for blocking light incident on the inside of the readout gate section 16 and the charge transfer path 15 formed in the substrate 6.

Though not shown in FIG. 2B, the solid-state image pickup device 1 in the example of the present embodiment has a color filter layer of R, G, and B formed for each pixel 7 over the wiring layer 11 via a planarizing layer, and further has an on-chip lens formed for each pixel 7 on the color filter layer.

In the solid-state image pickup device 1 having the above-described configuration, light condensed by the on-chip lens enters the light receiving section 2. Then, the light receiving section 2 generates a signal charge corresponding to the amount of the incident light, and accumulates the generated signal charge in the charge accumulating region 17. The signal charge accumulated in the light receiving section 2 is read out through the readout gate section 16 to the charge transfer path 15 by applying a readout voltage to the readout electrode 9 via the wiring layer 11. The signal charge read out to the charge transfer path 15 is transferred within the charge transfer path 15 in the vertical direction by applying a transfer voltage corresponding to four-phase driving, for example, to the first transfer electrode 10a and the second transfer electrode 10b in order in predetermined timing.

1-3 Manufacturing Method

Description will next be made of a method of manufacturing a pixel part in the example of the present embodiment with reference to FIGS. 4A to 6I, which are manufacturing process diagrams of the solid-state image pickup device 1 in the example of the present embodiment.

Figure 4A:
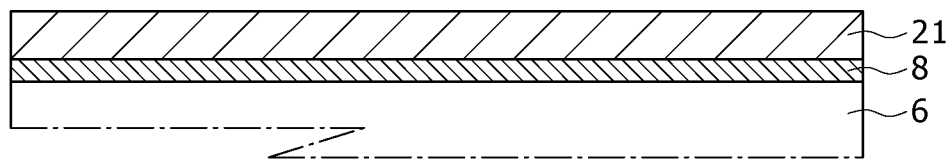
FIGS. 4A, 4B, 4C, and 4D are process diagrams (1) of a method for manufacturing the solid-state image pickup device in the first embodiment of the present invention.

First, as shown in FIG. 4A, an insulating film 8 made of a silicon oxide film is formed on the upper surface on the light incidence side of the substrate 6, and an electrode material film 21 made of an electrode material having a light shielding property is formed on the insulating film 8.

Figure 4B:
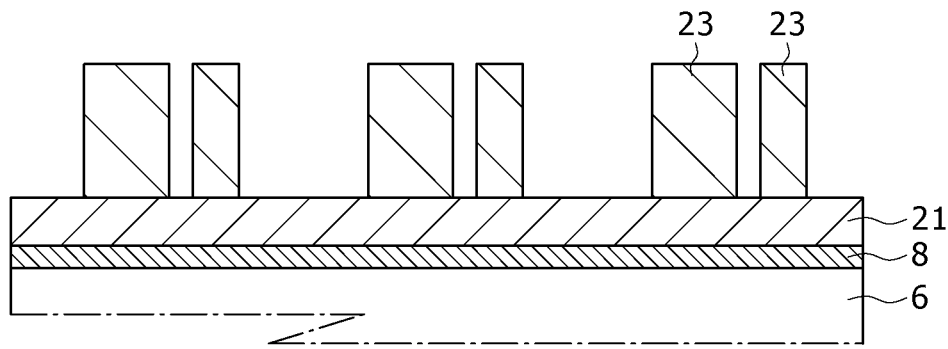

Next, as shown in FIG. 4B, a resist mask 23 having openings in desired regions is formed on the electrode material film 21. This resist mask 23 is formed by forming a photoresist layer on the electrode material film 21 and performing patterning such that the photoresist remains in only regions where the first transfer electrode 10a, the second transfer electrode 10b, and the readout electrode 9 shown in FIG. 3A are to be formed.

Figure 4C:
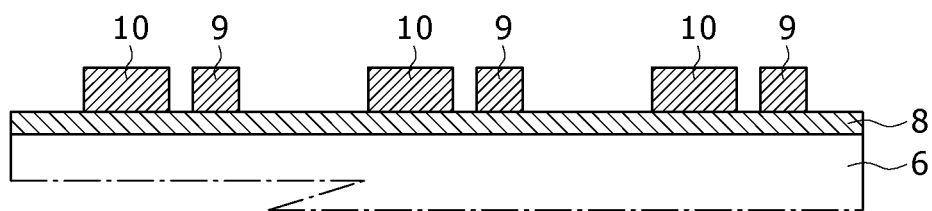

Next, the electrode material film is removed by dry etching via the resist mask 23, whereby the first transfer electrode 10a, the second transfer electrode 10b, and the readout electrode 9 are formed as shown in FIG. 4C. Then, the resist mask 23 is removed after the dry etching.

Figure 4D:
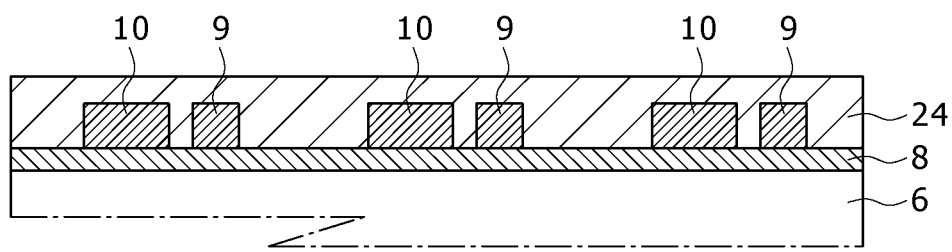

Next, as shown in FIG. 4D, an interlayer insulating film 24 is formed on the insulating film 8 including the first transfer electrode 10a, the second transfer electrode 10b, and the readout electrode 9. The formation of the interlayer insulating film 24 fills parts between the first transfer electrode 10a, the second transfer electrode 10b, and the readout electrode 9 with the interlayer insulating film 24.

Figure 5E:
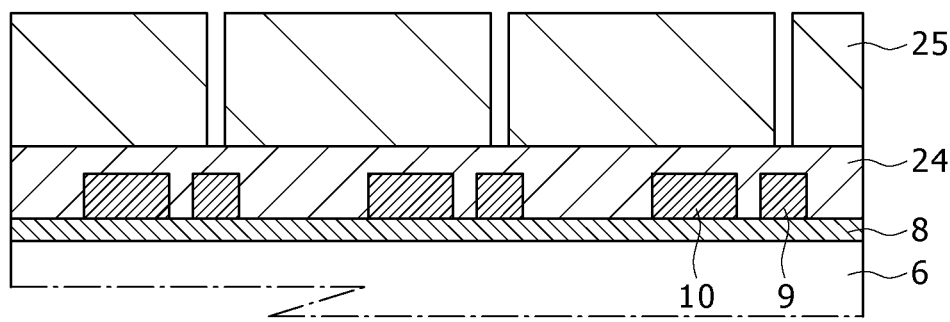
FIGS. 5E, 5F, 5G, and 5H are process diagrams (2) of the method for manufacturing the solid-state image pickup device in the first embodiment of the present invention.

Next, as shown in FIG. 5E, a resist mask 25 having openings in desired regions is formed on the interlayer insulating film 24. This resist mask 25 is formed by forming a photoresist layer and performing patterning such that the openings are formed in the desired regions on the readout electrode 9.

Figure 5F:
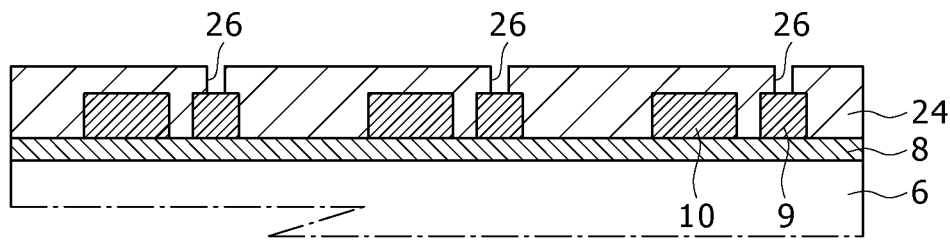

Next, the interlayer insulating film 24 is removed via the resist mask 25, whereby a contact hole 26 exposing the surface of the readout electrode 9 is formed on the readout electrode 9, as shown in FIG. 5F.

Figure 5G:
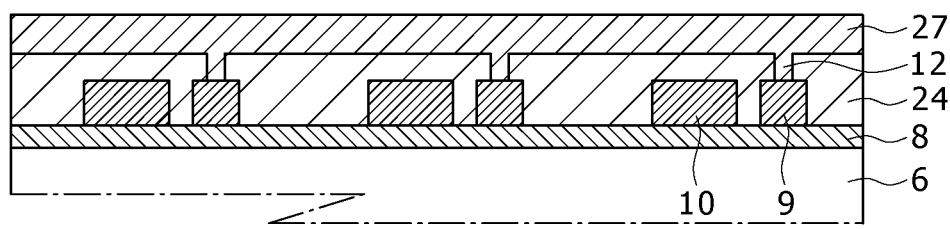

Next, as shown in FIG. 5G, a wiring material film 27 is formed by a wiring material having a light shielding property on the interlayer insulating film 24 including the contact hole 26. A contact part 12 is formed by filling the contact hole 26 with the wiring material.

Figure 5H:
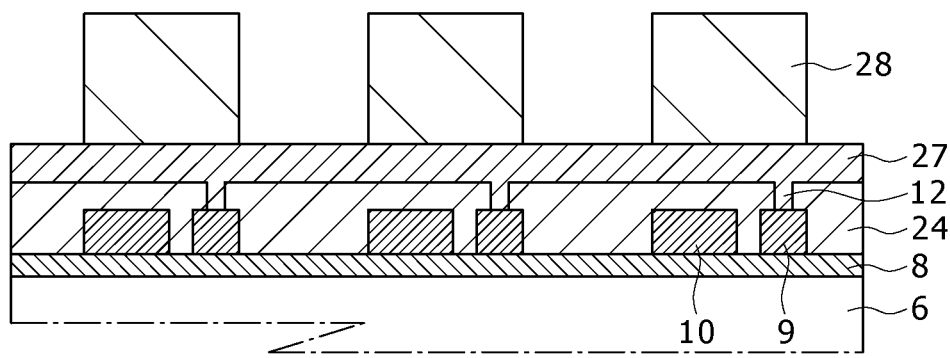

Next, as shown in FIG. 5H, a resist mask 28 having openings in desired regions is formed on the wiring material film 27. This resist mask 28 is formed by forming a photoresist layer on the wiring material film 27 and performing patterning such that the photoresist remains in only regions where the first transfer electrode 10a, the second transfer electrode 10b, and the readout electrode 9 are to be covered.

Figure 6I:
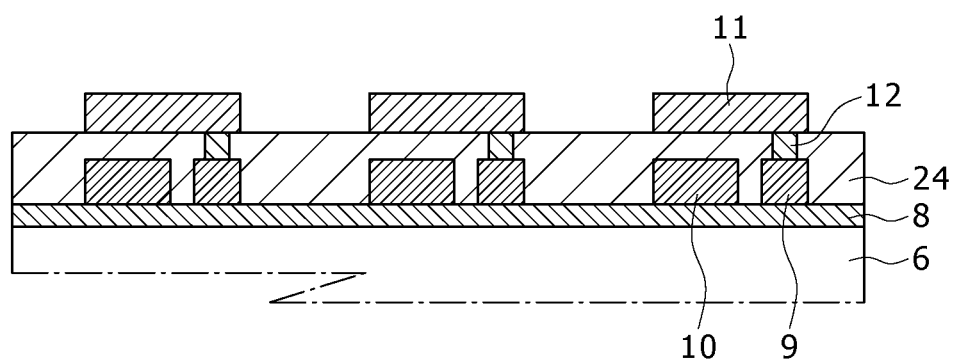
FIG. 6I is a process diagram (2) of the method for manufacturing the solid-state image pickup device in the first embodiment of the present invention.

Next, as shown in FIG. 6I, the wiring material film 27 is removed by dry etching via the resist mask 28, whereby a wiring layer 11 is formed.

Thereafter, though not shown in the figure, as in a method of manufacturing an ordinary solid-state image pickup device, a planarizing film, a color filter layer, and an on-chip lens are formed on the wiring layer 11. In addition, a light receiving section 2, a charge transfer path 15 and the like are formed in desired regions within the substrate 6 by ion implantation of impurities of desired conductivity types. The solid-state image pickup device 1 in the example of the present embodiment is thus completed.

In the example of the present embodiment, the first transfer electrode 10a, the second transfer electrode 10b, and the readout electrode 9 are formed in one patterning process. Therefore distances between the first transfer electrode 10a, the second transfer electrode 10b, and the readout electrode 9 can be made constant. In addition, in this patterning process, each electrode is formed by patterning an electrode material layer formed on a flat surface, and thus patterning can be performed with better accuracy. Because positional relation between the first transfer electrode 10a, the second transfer electrode 10b, and the readout electrode 9 is determined by one time of patterning, all pixels are free from variations in the distances between the first transfer electrode 10a, the second transfer electrode 10b, and the readout electrode 9. Thereby, signal charges can be read out by a constant readout voltage, so that variations in the readout voltage can be prevented. In addition, because the distances between the first transfer electrode 10a, the second transfer electrode 10b, and the readout electrode 9 can be controlled with high precision, an increase in the readout voltage can be prevented, and thus power consumption can be reduced.

In addition, because the readout electrode 9 is formed by patterning, the width of the readout electrode 9 itself can also be formed with high precision in all the pixels.

When a signal charge is read out from the light receiving section 2 in the thus formed solid-state image pickup device, a voltage necessary to crush the barrier of the readout gate section 16 and the light receiving section 2 is applied to the readout electrode 9, as described with reference to FIGS. 29A and 29B. In addition, because the barrier is crushed by the readout electrode 9 without as high a voltage as the readout voltage being applied to the first transfer electrode 10a and the second transfer electrode 10b, electrons due to the potential of the light receiving section 2 and the charge transfer path 15 can be read out. Thus, as compared with an existing solid-state image pickup device in which a readout electrode and a transfer electrode are formed integrally with each other, high voltage is not applied to the opposite side from the readout side, and thus a white defect due to a high electrical field does not occur easily.

In addition, in the solid-state image pickup device 1 in the example of the present embodiment, the first transfer electrode 10a, the second transfer electrode 10b, and the readout electrode 9 are formed by a light shielding material. Thus, incident light can be prevented from entering the charge transfer path 15, and a smear can be reduced. Further, because the wiring layer 11 made of a light shielding material is formed over the first transfer electrode 10a, the second transfer electrode 10b, and the readout electrode 9, a smear is further suppressed.

In the example of the present embodiment, as shown in FIG. 4A to 6I, the first transfer electrode 10a, the second transfer electrode 10b, and the readout electrode 9 are directly formed by patterning an electrode material film having a light shielding property. However, a gate-last process may be used.

When the gate-last process is used, a dummy first transfer electrode, a dummy second transfer electrode, and a dummy readout electrode are formed, and these dummy electrodes are removed by using a low-damage process such as a wet process or the like. Thereafter, an electrode material having a light shielding property is formed, and an unnecessary electrode material is removed by using a CMP (Chemical Mechanical Polishing) method or the like, whereby the first transfer electrode 10a, the second transfer electrode 10b, and the readout electrode 9 are formed. Also in the case of thus using the gate-last process, the positional relation and line width of the first transfer electrode 10a, the second transfer electrode 10b, and the readout electrode 9 are determined by one time of patterning. Thus, variations in the positional relation and line width of the first transfer electrode 10a, the second transfer electrode 10b, and the readout electrode 9 can be suppressed.

In addition, a damascene method used commonly can be used to form the first transfer electrode 10a, the second transfer electrode 10b, and the readout electrode 9. In that case, a groove for forming the contact part 12, the first transfer electrode 10a, the second transfer electrode 10b, and the readout electrode 9 is formed first, and is thereafter filled with an electrode material. Finally an excess material is removed by a CMP method.

2. Second Embodiment

Solid-State Image Pickup Device

Figure 7A:
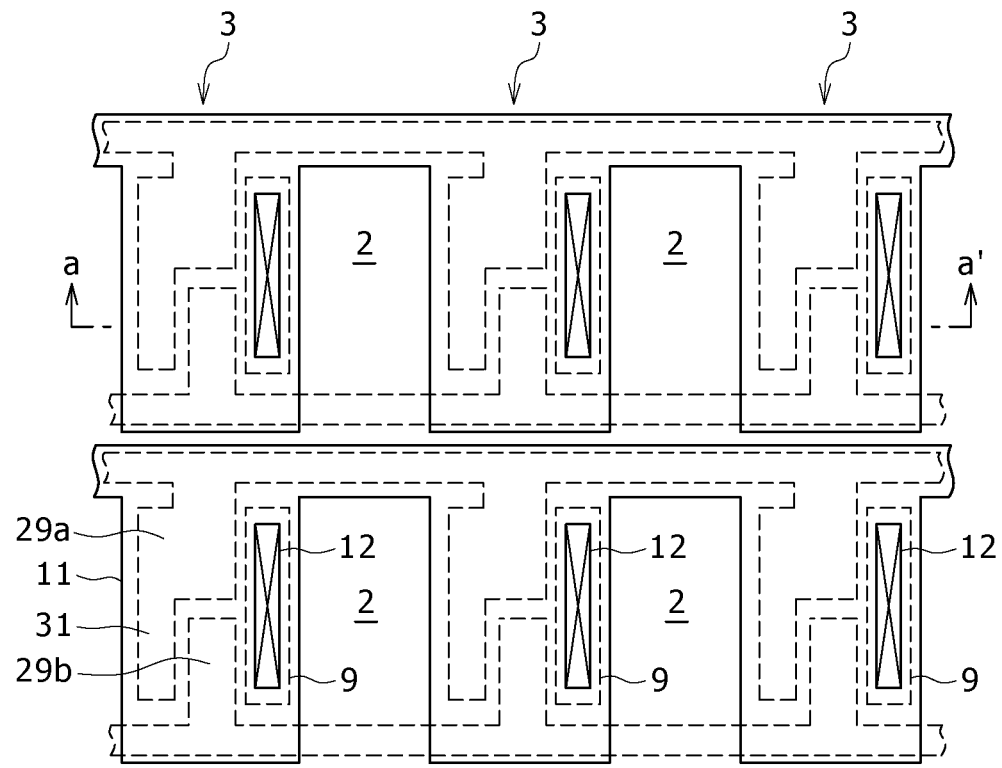
FIGS. 7A and 7B are a schematic plan configuration diagram of principal parts of a solid-state image pickup device according to a second embodiment of the present invention and a sectional configuration diagram taken along a line a-a' in FIG. 7A.
Figure 7B:
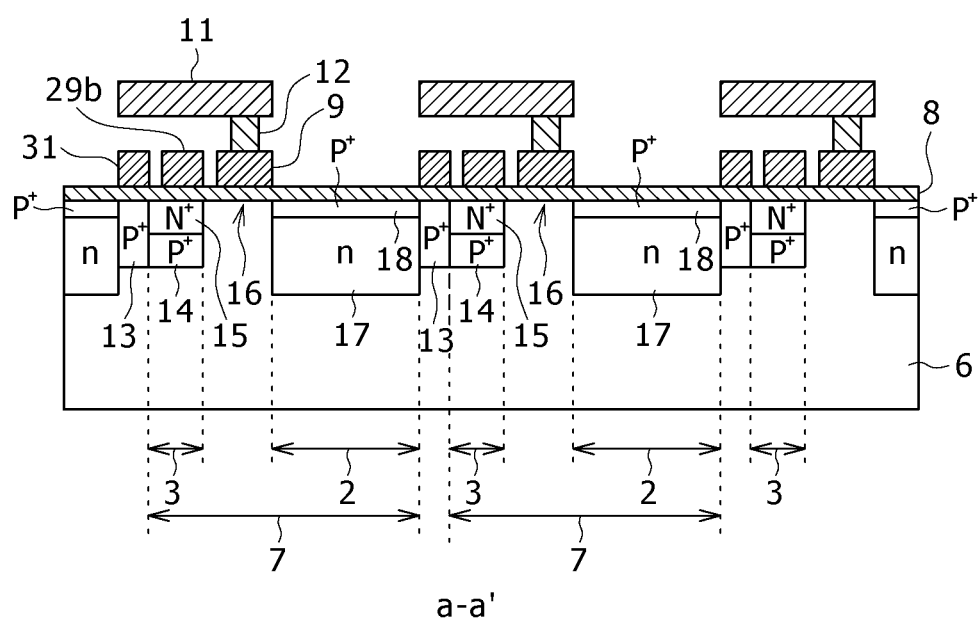

A solid-state image pickup device according to a second embodiment of the present invention will next be described. FIG. 7A shows a schematic plan configuration of the solid-state image pickup device in the example of the present embodiment. FIG. 7B is a schematic sectional configuration diagram taken along a line a-a' in FIG. 7A. In FIGS. 7A and 7B, parts corresponding to those of FIGS. 2A and 2B are identified by the same reference symbols, and repeated description thereof will be omitted. In addition, the configuration of the whole of the solid-state image pickup device in the example of the present embodiment is similar to FIG. 1. Thus, the configuration of the whole of the solid-state image pickup device in the example of the present embodiment is not shown, and repeated description thereof will be omitted.

A pixel 7 in the solid-state image pickup device in the example of the present embodiment includes a light receiving section 2, a charge transfer path 15, and a readout gate section 16 formed in a substrate 6 as well as a first transfer electrode 29a, a second transfer electrode 29b, and a readout electrode 9 formed on the substrate 6. In addition, a wiring layer 11 is formed over the first transfer electrode 29a, the second transfer electrode 29b, and the readout electrode 9.

In the example of the present embodiment, the shape of the first transfer electrode 29a is different from the configuration of the first embodiment.

Figure 8:
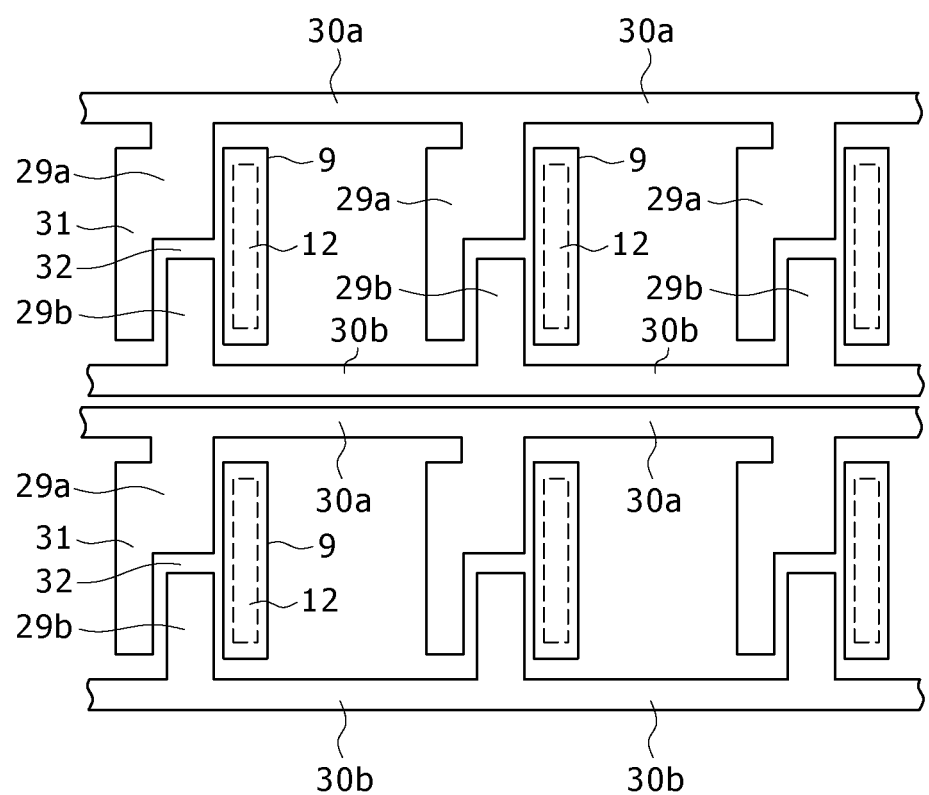
FIG. 8 is a plan configuration diagram of only a first transfer electrode, a second transfer electrode, and a readout electrode.

FIG. 8 is a schematic plan configuration diagram showing only the first transfer electrode 29a, the second transfer electrode 29b, and the readout electrode 9. Incidentally, in the example of the present embodiment, the plane shape of the wiring layer 11 is similar to that of FIG. 3B, and is thus not shown in figures.

In the example of the present embodiment, as shown in FIG. 7B and FIG. 8, the first transfer electrode 29a and the second transfer electrode 29b are formed on the charge transfer path 15 with an insulating film interposed between the first transfer electrode 29a and the second transfer electrode 29b and the charge transfer path 15, and are formed in order in a vertical direction. A light shielding dedicated electrode 31 such as covers a gap 32 between the first transfer electrode 29a and the second transfer electrode 29b from a side is formed by partially extending an end part of the first transfer electrode 29a. In this case, the light shielding dedicated electrode 31 made of a projecting part of the first transfer electrode 29a is formed so as to be situated above an element isolation region 13, as shown in FIG. 7B.

Also in the example of the present embodiment, the first transfer electrode 29a, the second transfer electrode 29b, and the readout electrode 9 formed independently of each other in a same single layer are formed by an electrode material having a light shielding property. Applicable as the electrode material are for example W (tungsten), Ti (titanium), Cu (copper), and Ta (tantalum), compounds thereof, and oxides, nitrides, or silicides thereof. The first transfer electrode 29a, the second transfer electrode 29b, and the readout electrode 9 thus formed in the same single layer can be formed by a manufacturing method similar to that of the first embodiment. That is, also in the example of the present embodiment, variations in the positional relation, line width and the like of the first transfer electrode 29a, the second transfer electrode 29b, and the readout electrode 9 can be reduced by forming the first transfer electrode 29a, the second transfer electrode 29b, and the readout electrode 9 by same patterning.

Further, also in the example of the present embodiment, as shown in FIG. 7A, the wiring layer 11 is formed so as to cover the first transfer electrode 29a, the second transfer electrode 29b, and the readout electrode 9, and the wiring layer 11 is connected to the readout electrode 9 via a contact part 12.

In the solid-state image pickup device in the example of the present embodiment having such a configuration, the gap 32 between the first transfer electrode 29a and the second transfer electrode 29b is covered by the light shielding dedicated electrode 31 on a side where the readout electrode 9 is not formed. The first transfer electrode 29a is formed by an electrode material having a light shielding property. Thus, by forming the light shielding dedicated electrode 31 of the first transfer electrode 29a, it is possible to prevent obliquely incident light from entering the charge transfer path 15 from the side of the gap 32 formed between the first transfer electrode 29a and the second transfer electrode 29b.

In addition, the first transfer electrode 29a, the second transfer electrode 29b, and the readout electrode 9 are covered by the wiring layer 11 having a light shielding property. It is thus possible to prevent light from entering the charge transfer path 15 from above these electrodes.

In the solid-state image pickup device in the example of the present embodiment, a signal charge accumulated in the light receiving section 2 is read out through the readout gate section 16 to the charge transfer path 15 by applying a readout voltage to the readout electrode 9 via the wiring layer 11. A vertical transfer register 3 performs four-phase driving by supplying for example a four-phase driving voltage to each of the first transfer electrode 29a and the second transfer electrode 29b. Thereby, the signal charge read out to the charge transfer path 15 is transferred in the vertical direction.

In the solid-state image pickup device in the example of the present embodiment, because the light shielding dedicated electrode 31 is formed, oblique light incident from the opposite side from the side where the readout electrode 9 is formed and light from a top surface can be prevented from entering the charge transfer path 15, so that a smear characteristic is improved.

Other effects similar to those of the first embodiment can be obtained.

3. Third Embodiment

Solid-State Image Pickup Device

Figure 9A:
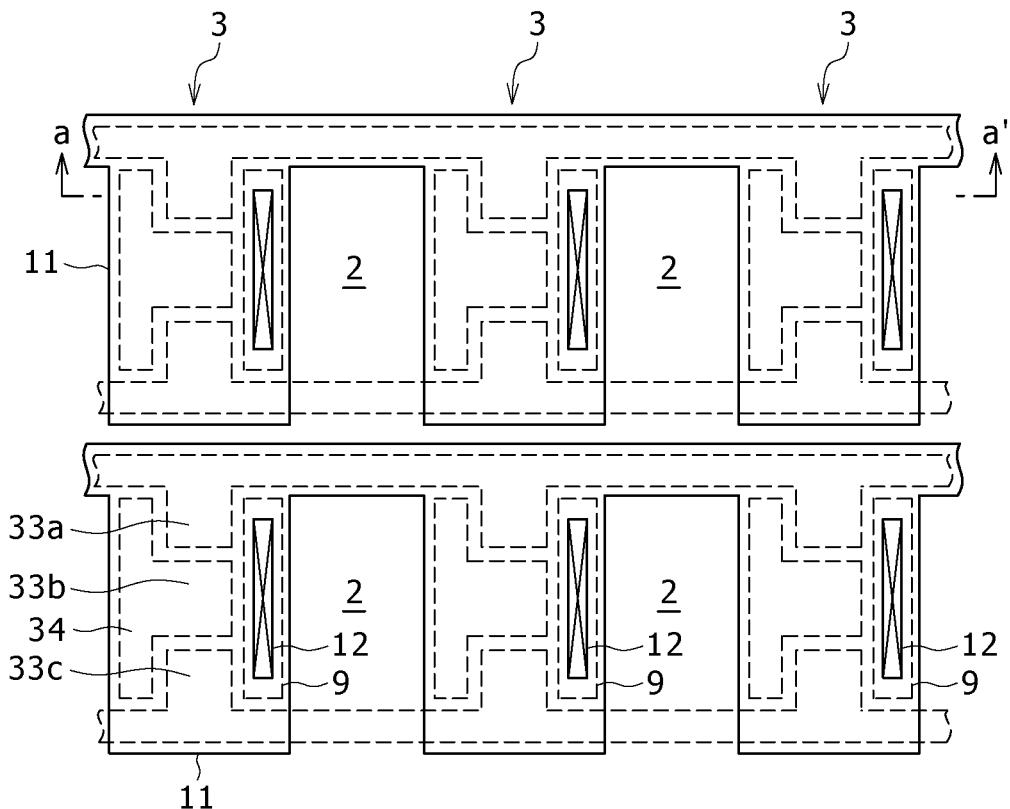
FIGS. 9A and 9B are a schematic plan configuration diagram of principal parts of a solid-state image pickup device according to a third embodiment of the present invention and a sectional configuration diagram taken along a line a-a' in FIG. 9A.
Figure 9B:
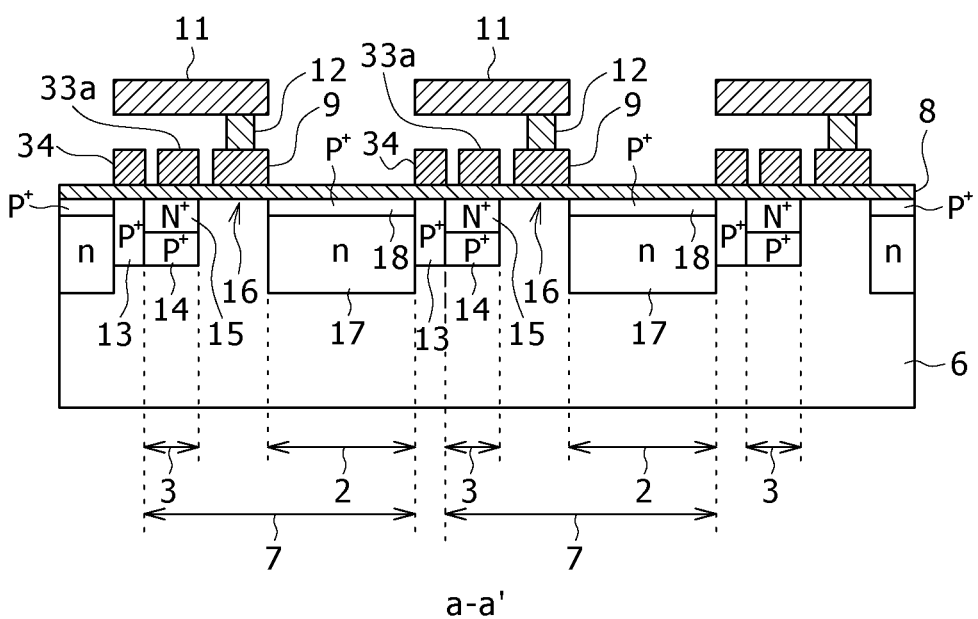

A solid-state image pickup device according to a third embodiment of the present invention will next be described. FIG. 9A shows a schematic plan configuration of the solid-state image pickup device in the example of the present embodiment. FIG. 9B is a schematic sectional configuration diagram taken along a line a-a' in FIG. 9A. In FIGS. 9A and 9B, parts corresponding to those of FIGS. 2A and 2B are identified by the same reference symbols, and repeated description thereof will be omitted. In addition, the configuration of the whole of the solid-state image pickup device in the example of the present embodiment is similar to FIG. 1, and thus repeated description thereof will be omitted.

A pixel 7 in the solid-state image pickup device in the example of the present embodiment includes a light receiving section 2, a charge transfer path 15, and a readout gate section 16 formed in a substrate 6 as well as a first to a third transfer electrode 33a to 33c and a readout electrode 9 formed on the substrate 6. In addition, a wiring layer 11 is formed over the first to third transfer electrodes 33a to 33c and the readout electrode 9.

In the example of the present embodiment, the configuration of the transfer electrodes is different from that of the solid-state image pickup device according to the first embodiment.

Figure 10:
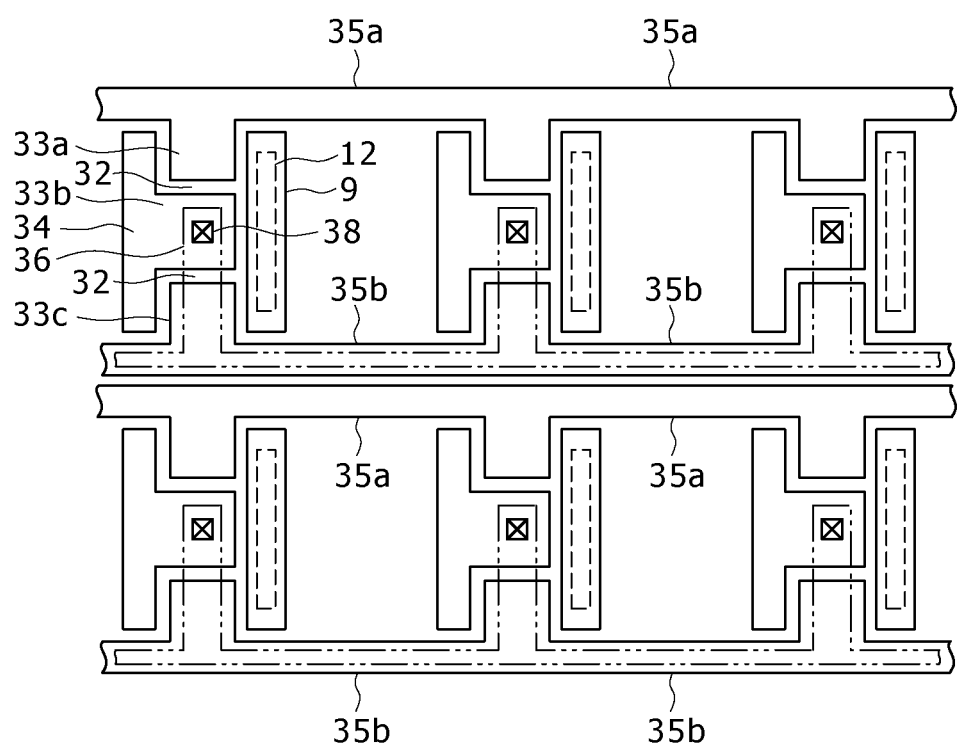
FIG. 10 is a plan configuration diagram of only a first to a third transfer electrode and a readout electrode.

FIG. 10 is a schematic plan configuration diagram of only the first transfer electrode 33a, the second transfer electrode 33b, the third transfer electrode 33c, and the readout electrode 9.

In the solid-state image pickup device in the example of the present embodiment, as shown in FIGS. 9A and 9B, the first to third transfer electrodes 33a to 33c are formed on the charge transfer path 15 with an insulating film 8 interposed between the first to third transfer electrodes 33a to 33c and the charge transfer path 15. In addition, as shown in FIG. 10, the first to third transfer electrodes 33a to 33c are formed over the charge transfer path 15 in order such that the second transfer electrode 33b is formed between the first transfer electrode 33a and the third transfer electrode 33c. The first transfer electrode 33a is connected to a first transfer electrode 33a forming a pixel 7 formed in the same row via a wiring section 35a. The third transfer electrode 33c is connected to a third transfer electrode 33c forming the pixel 7 in the same row via a wiring section 35b.

The second transfer electrode 33b is formed in the shape of a floating island between the first transfer electrode 33a and the third transfer electrode 33c independently of the first transfer electrode 33a and the third transfer electrode 33c. In addition, a light shielding dedicated electrode 34 such as covers gaps 32 formed between the first to third transfer electrodes 33a to 33c on an opposite side from a side where the readout electrode 9 is formed is formed by partially extending an end part of the second transfer electrode 33b. In this case, the light shielding dedicated electrode 34 made of the extending part of the second transfer electrode 33b is formed so as to be situated above an element isolation region 13 formed between adjacent pixels 7, as shown in FIG. 9B.

Also in the example of the present embodiment, the first to third transfer electrodes 33a to 33c and the readout electrode 9 formed independently of each other in a same single layer are formed by an electrode material having a light shielding property. Applicable as the electrode material are for example W (tungsten), Ti (titanium), Cu (copper), and Ta (tantalum), compounds thereof, and oxides, nitrides, or silicides thereof. The first to third transfer electrodes 33a to 33c and the readout electrode 9 thus formed in the same single layer can be formed by a manufacturing method similar to that of the first embodiment. That is, also in the example of the present embodiment, variations in the positional relation, line width and the like of the first to third transfer electrodes 33a to 33c and the readout electrode 9 can be reduced by forming the first to third transfer electrodes 33a to 33c and the readout electrode 9 by same patterning.

Though not shown in FIG. 9A or 9B, as shown in FIG. 10, shunt wiring 36 is disposed in a layer above the second transfer electrode 33b via an interlayer insulating film, and the shunt wiring 36 is connected to the second transfer electrode 33b via a contact part 38. This shunt wiring 36 is formed so as to extend above the third transfer electrode 33c and the wiring section 35b. The third transfer electrode 33c is electrically connected to a second transfer electrode 33b forming a pixel 7 in the same row by the shunt wiring 36. In the example of the present embodiment, a desired transfer voltage is supplied to the second transfer electrode 33b via the shunt wiring 36.

Further, also in the example of the present embodiment, as shown in FIG. 9A, the wiring layer 11 is formed so as to cover the first to third transfer electrodes 33a to 33c and the readout electrode 9, and the wiring layer 11 is connected to the readout electrode 9 via a contact part 12.

In the solid-state image pickup device in the example of the present embodiment having such a configuration, the gaps 32 between the first transfer electrode 33a, the second transfer electrode 33b, and the third transfer electrode 33c are covered by the light shielding dedicated electrode 34 on a side where the readout electrode 9 is not formed. Thus, by forming the light shielding dedicated electrode 34 of the second transfer electrode 33b, it is possible to prevent obliquely incident light from entering the charge transfer path 15 from the side of the gaps 32 formed between the first to third transfer electrodes 33a to 33c.

In addition, the first transfer electrode 33a, the second transfer electrode 33b, the third transfer electrode 33c, and the readout electrode 9 are covered by the wiring layer 11 having a light shielding property. It is thus possible to prevent light from entering the charge transfer path 15 from above the electrodes.

In the solid-state image pickup device in the example of the present embodiment, a signal charge accumulated in the light receiving section 2 is read out through the readout gate section 16 to the charge transfer path 15 by applying a readout voltage to the readout electrode 9 via the wiring layer 11. A vertical transfer register 3 performs three-phase driving by supplying for example a three-phase driving voltage to each of the first to third transfer electrodes 33a to 33c. Thereby, the signal charge read out to the charge transfer path 15 is transferred in the vertical direction.

The solid-state image pickup device in the example of the present embodiment can provide similar effects to those of the first and second embodiments.

4. Fourth Embodiment

Solid-State Image Pickup Device

Figure 11A:
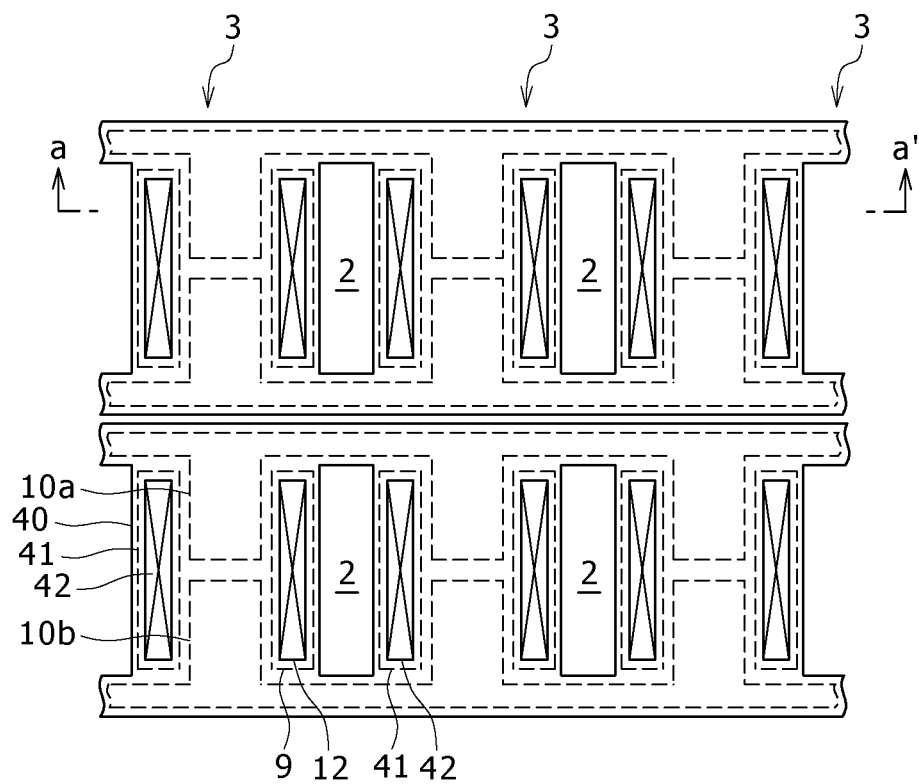
FIGS. 11A and 11B are a schematic plan configuration diagram of principal parts of a solid-state image pickup device according to a fourth embodiment of the present invention and a sectional configuration diagram taken along a line a-a' in FIG. 11A.
Figure 11B:
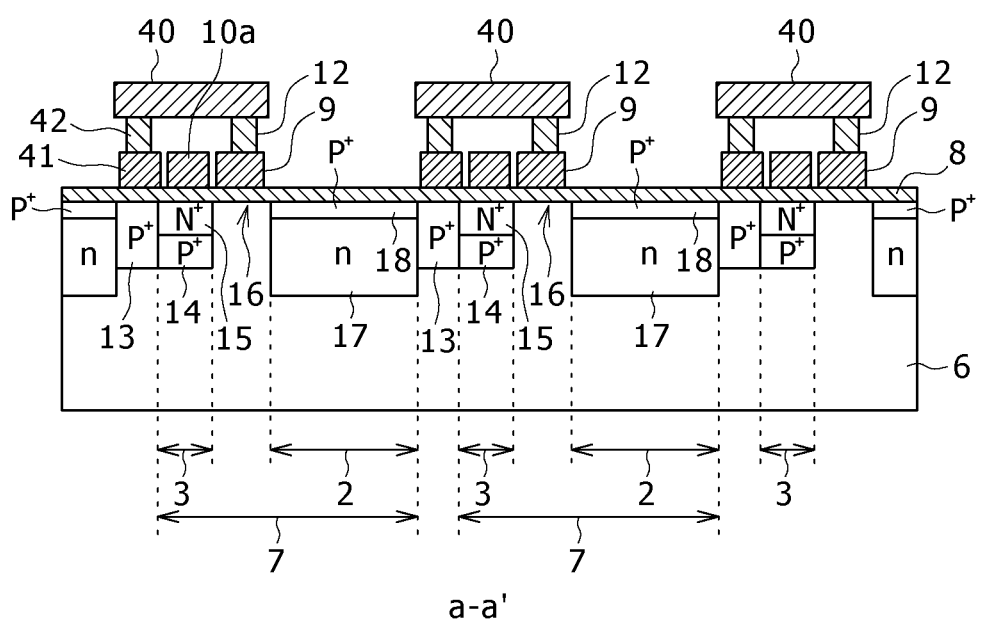

A solid-state image pickup device according to a fourth embodiment of the present invention will next be described. FIG. 11A shows a schematic plan configuration of the solid-state image pickup device in the example of the present embodiment. FIG. 11B is a schematic sectional configuration diagram taken along a line a-a' in FIG. 11A. In FIGS. 11A and 11B, parts corresponding to those of FIGS. 2A and 2B are identified by the same reference symbols, and repeated description thereof will be omitted. In addition, the configuration of the whole of the solid-state image pickup device in the example of the present embodiment is similar to FIG. 1, and therefore repeated description thereof will be omitted.

A pixel 7 in the solid-state image pickup device in the example of the present embodiment includes a light receiving section 2, a charge transfer path 15, and a readout gate section 16 formed in a substrate 6 as well as a first transfer electrode 10a, a second transfer electrode 10b, a readout electrode 9, and a light shielding dedicated electrode 41 formed on the substrate 6. In addition, a wiring layer 40 is formed over the first transfer electrode 10a, the second transfer electrode 10b, the readout electrode 9, and the light shielding dedicated electrode 41. The example of the present embodiment is an example in which the first embodiment further includes the light shielding dedicated electrode 41.

Figure 12A:
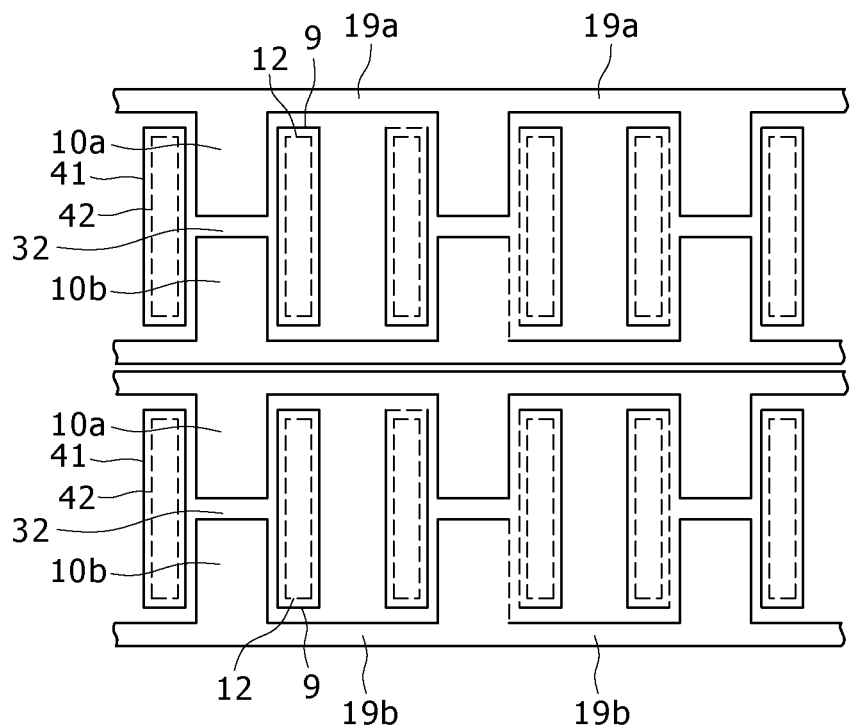
FIGS. 12A and 12B are a plan configuration diagram of only a first transfer electrode, a second transfer electrode, and a readout electrode and a plan configuration diagram of only a wiring layer.
Figure 12B:
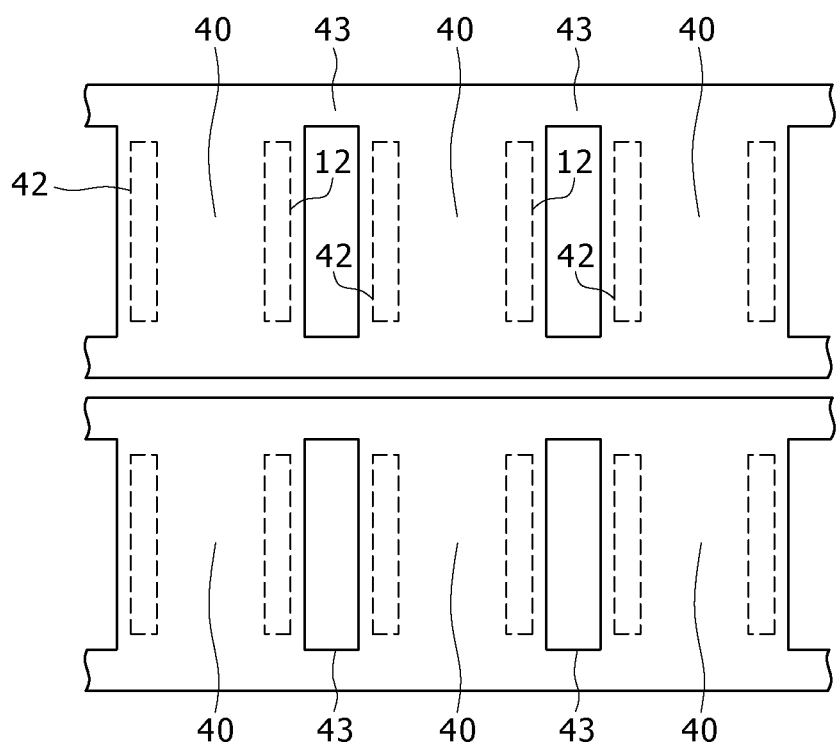

FIG. 12A shows a schematic plan configuration of only the first transfer electrode 10a, the second transfer electrode 10b, and the readout electrode 9. FIG. 12B shows a schematic plan configuration of only the wiring layer 40.

In the example of the present embodiment, as shown in FIG. 12A, the light shielding dedicated electrode 41 is formed on an opposite side of the first transfer electrode 10a and the second transfer electrode 10b from a side where the readout electrode 9 is formed. In addition, the light shielding dedicated electrode 41 is formed so as to cover a gap 32 between the first transfer electrode 10a and the second transfer electrode 10b from a side. This light shielding dedicated electrode 41 is formed independently of the first transfer electrode 10a, the second transfer electrode 10b, and the readout electrode 9, and is formed in a same single layer as the first transfer electrode 10a, the second transfer electrode 10b, and the readout electrode 9. Further, the light shielding dedicated electrode 41 is formed above an element isolation region 13 formed between adjacent pixels 7.

As shown in FIG. 12B, the wiring layer 40 is formed so as to cover the first transfer electrode 10a, the second transfer electrode 10b, the readout electrode 9, and the light shielding dedicated electrode 41. The wiring layer 40 is electrically connected to the readout electrode 9 via a contact part 12, and is connected to the light shielding dedicated electrode 41 via a contact part 42.

Also in the example of the present embodiment, the first transfer electrode 10a, the second transfer electrode 10b, the readout electrode 9, and the light shielding dedicated electrode 41 formed independently of each other in the same single layer are formed by an electrode material having a light shielding property. Applicable as the electrode material are for example W (tungsten), Ti (titanium), Cu (copper), and Ta (tantalum), compounds thereof, and oxides, nitrides, or silicides thereof. The first transfer electrode 10a, the second transfer electrode 10b, the readout electrode 9, and the light shielding dedicated electrode 41 thus formed in the same single layer can be formed by a manufacturing method similar to that of the first embodiment. That is, also in the example of the present embodiment, variations in the positional relation, line width and the like of the first transfer electrode 10a, the second transfer electrode 10b, the readout electrode 9, and the light shielding dedicated electrode 41 can be reduced by simultaneously forming the first transfer electrode 10a, the second transfer electrode 10b, the readout electrode 9, and the light shielding dedicated electrode 41 by one time of patterning.

In addition, in the example of the present embodiment, the wiring layer 40 is connected to a wiring layer 40 forming a pixel 7 in the same row by connecting wiring 43. In the example of the present embodiment, the wiring layer 40 is connected also to the light shielding dedicated electrode 41 via the contact part 42. Thus, when a readout voltage is supplied to the readout electrode 9 via the wiring layer 40, the readout voltage is also supplied to the light shielding dedicated electrode 41. However, because the light shielding dedicated electrode 41 is formed above the element isolation region 13 formed between the adjacent pixels, no signal charge is read out from the side of the light shielding dedicated electrode 41 to the charge transfer path 15.

In the solid-state image pickup device in the example of the present embodiment having such a configuration, the gap 32 between the first transfer electrode 10a and the second transfer electrode 10b is covered by the light shielding dedicated electrode 41 on a side where the readout electrode 9 is not formed. The thus formed light shielding dedicated electrode 41 can prevent light from entering the charge transfer path 15 from the side of the gap 32 formed between the first transfer electrode 10a and the second transfer electrode 10b.

In addition, the first transfer electrode 10a, the second transfer electrode 10b, the light shielding dedicated electrode 41, and the readout electrode 9 are covered by the wiring layer 40 having a light shielding property. It is thus possible to prevent light from entering the charge transfer path 15 from above these electrodes.

In the solid-state image pickup device in the example of the present embodiment having the above-described configuration, a signal charge accumulated in the light receiving section 2 is read out through the readout gate section 16 to the charge transfer path 15 by applying a readout voltage to the readout electrode 9 via the wiring layer 40. A vertical transfer register 3 performs four-phase driving by supplying for example a four-phase driving voltage to each of the first transfer electrode 10a and the second transfer electrode 10b. Thereby, the signal charge read out to the charge transfer path 15 is transferred in the vertical direction.

The solid-state image pickup device in the example of the present embodiment can provide similar effects to those of the first and second embodiments.

5. Fifth Embodiment

Solid-State Image Pickup Device

Figure 13A:
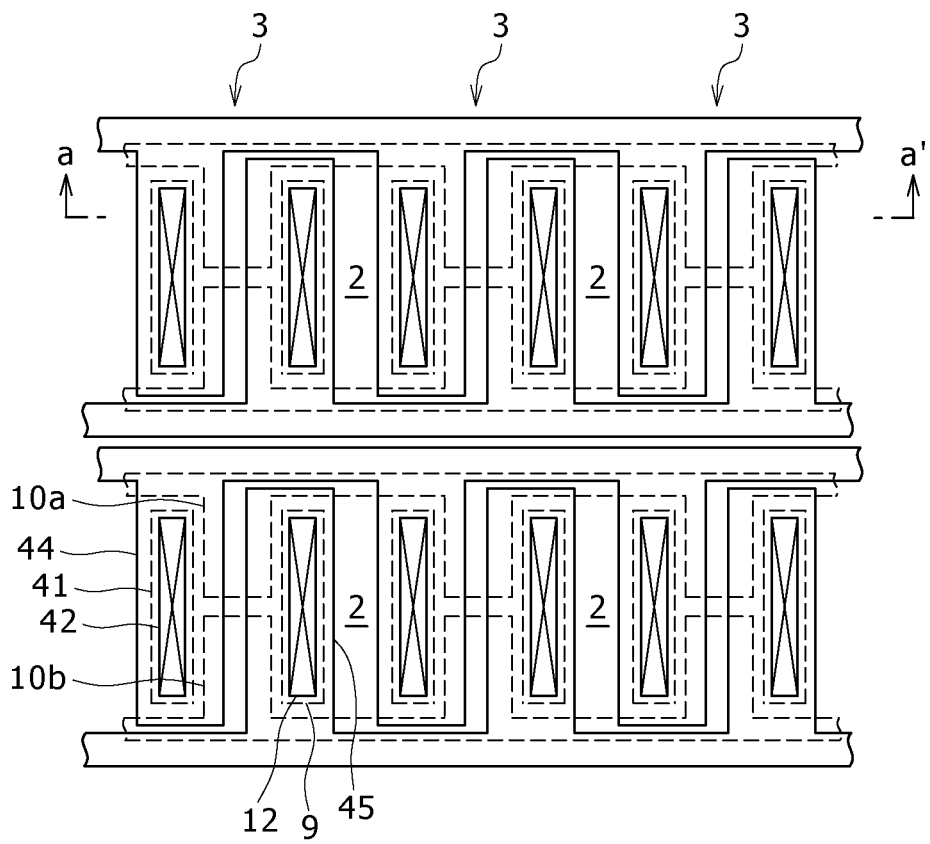
FIGS. 13A and 13B are a schematic plan configuration diagram of principal parts of a solid-state image pickup device according to a fifth embodiment of the present invention and a sectional configuration diagram taken along a line a-a' in FIG. 13A.
Figure 13B:
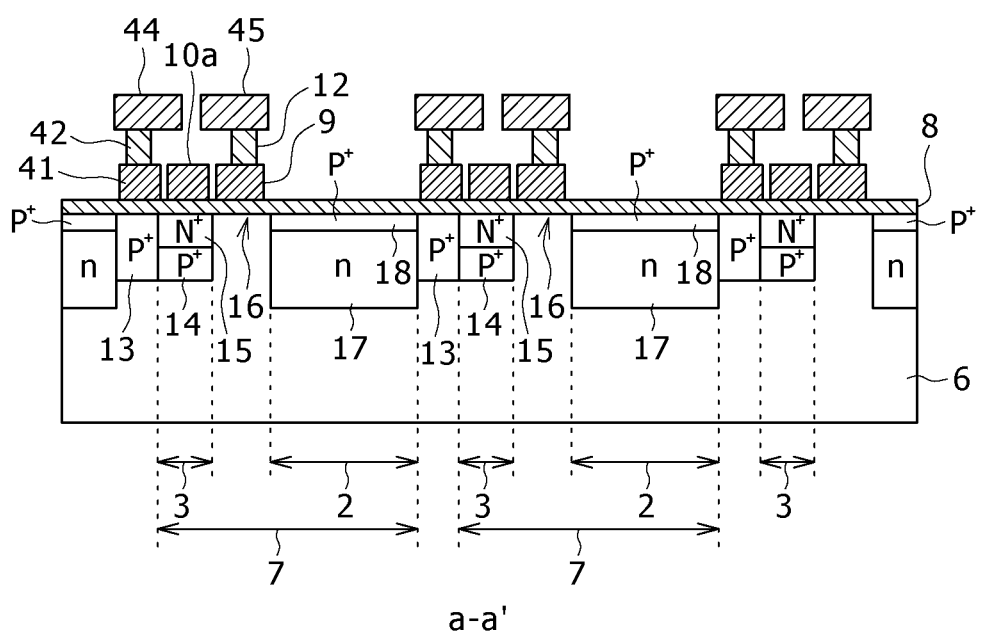

A solid-state image pickup device according to a fifth embodiment of the present invention will next be described. FIG. 13A shows a schematic plan configuration of the solid-state image pickup device in the example of the present embodiment. FIG. 13B is a schematic sectional configuration diagram taken along a line a-a' in FIG. 13A. In FIGS. 13A and 13B, parts corresponding to those of FIGS. 2A and 2B are identified by the same reference symbols, and repeated description thereof will be omitted. In addition, the configuration of the whole of the solid-state image pickup device in the example of the present embodiment is similar to FIG. 1, and therefore repeated description thereof will be omitted.

A pixel 7 in the solid-state image pickup device in the example of the present embodiment includes a light receiving section 2, a charge transfer path 15, and a readout gate section 16 formed in a substrate 6 as well as a first transfer electrode 10a, a second transfer electrode 10b, a readout electrode 9, and a light shielding dedicated electrode 41 formed on the substrate 6. In addition, a first wiring layer 44 and a second wiring layer 45 is formed above the first transfer electrode 10a, the second transfer electrode 10b, the readout electrode 9, and the light shielding dedicated electrode 41. The example of the present embodiment has a different wiring layer configuration from the solid-state image pickup device according to the fourth embodiment.

Figure 14A:
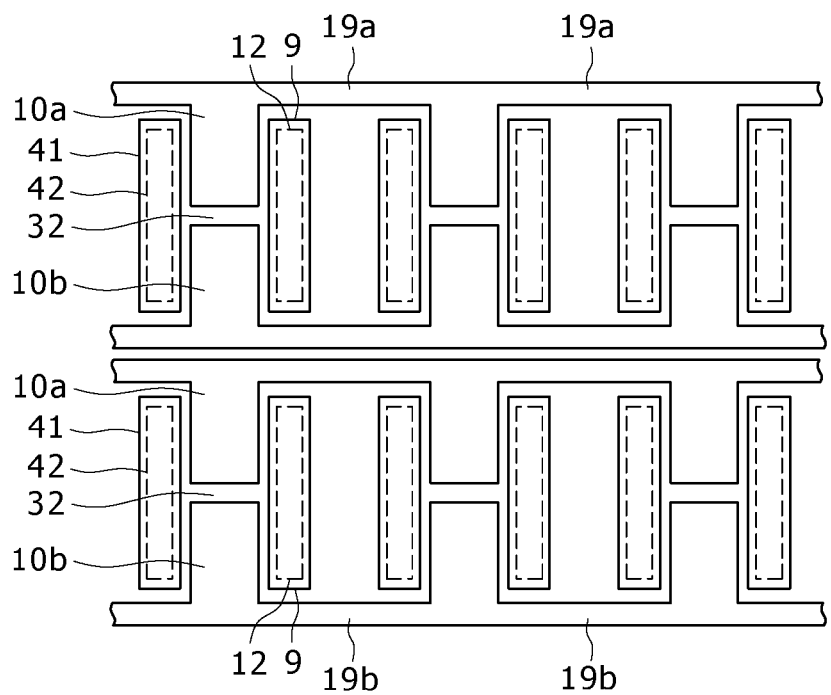
FIGS. 14A and 14B are a plan configuration diagram of only a first transfer electrode, a second transfer electrode, and a readout electrode and a plan configuration diagram of only a wiring layer.
Figure 14B:
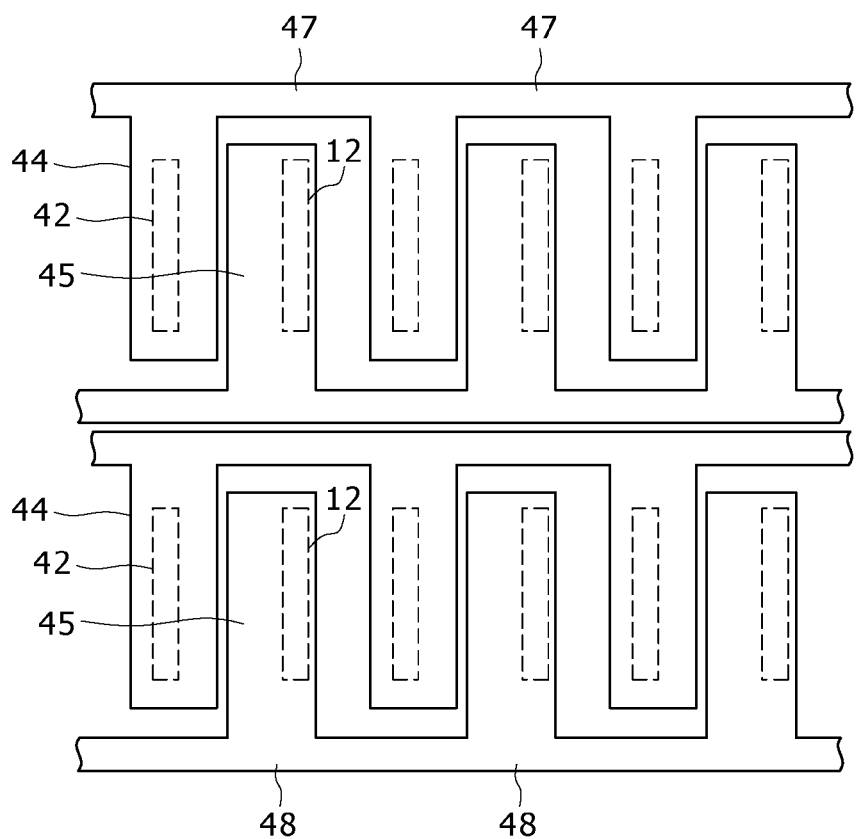

FIG. 14A is a plan view of the first transfer electrode 10a, the second transfer electrode 10b, and the readout electrode 9. FIG. 14B is a plan view of the first wiring layer 44 and the second wiring layer 45.

In the example of the present embodiment, as shown in FIG. 14A, the first transfer electrode 10a, the second transfer electrode 10b, the light shielding dedicated electrode 41, and the readout electrode 9 have a similar configuration to that of the solid-state image pickup device according to the fourth embodiment.

As shown in FIG. 13B and FIG. 14B, the first wiring layer 44 and the second wiring layer 45 are formed above the first transfer electrode 10a, the second transfer electrode 10b, the readout electrode 9, and the light shielding dedicated electrode 41 via an interlayer insulating film not shown in the figures. The first wiring layer 44 is formed so as to cover mainly the readout electrode 9. The second wiring layer 45 is formed so as to cover mainly the light shielding dedicated electrode 41. The first wiring layer 44 is connected to the readout electrode 9 via a contact part 12. The second wiring layer 45 is electrically connected to the light shielding dedicated electrode 41 via a contact part 42. In addition, as shown in FIG. 14B, the first wiring layer 44 is connected to a first wiring layer 44 forming a pixel 7 in the same row by a wiring section 47, and the second wiring layer 45 is connected to a second wiring layer 45 forming the pixel 7 in the same row by a wiring section 48.

Also in the example of the present embodiment, the first transfer electrode 10a, the second transfer electrode 10b, the readout electrode 9, and the light shielding dedicated electrode 41 formed independently of each other in the same single layer are formed by an electrode material having a light shielding property. Applicable as the electrode material are for example W (tungsten), Ti (titanium), Cu (copper), and Ta (tantalum), compounds thereof, and oxides, nitrides, or silicides thereof. The first transfer electrode 10a, the second transfer electrode 10b, the readout electrode 9, and the light shielding dedicated electrode 41 thus formed in the same single layer can be formed by a manufacturing method similar to that of the first embodiment. That is, also in the example of the present embodiment, variations in the positional relation, line width and the like of the first transfer electrode 10a, the second transfer electrode 10b, the readout electrode 9, and the light shielding dedicated electrode 41 can be reduced by simultaneously forming the first transfer electrode 10a, the second transfer electrode 10b, the readout electrode 9, and the light shielding dedicated electrode 41 by one time of patterning.

Further, also in the example of the present embodiment, the first wiring layer 44 and the second wiring layer 45 are formed by a wiring material having a light shielding property. In the example of the present embodiment, a readout voltage is supplied to the readout electrode 9 via the first wiring layer 44, and an arbitrary fixed voltage is supplied to the light shielding dedicated electrode 41 via the second wiring layer 45. Because the potentials of the light shielding dedicated electrode 41 and the readout electrode 9 can be controlled independently of each other, a high electric field such as the readout voltage or the like is not applied to the vicinity of the light shielding dedicated electrode 41. In addition, separately controlling the potentials of the readout electrode 9 and the light shielding dedicated electrode 41 sandwiching the transfer electrodes prevents application of an electric field to an opposite side from a readout side at the time of readout. Thereby, the example of the present embodiment prevents reverse readout from an adjacent pixel, and suppresses the occurrence of a white defect due to a high electric field more than the second embodiment.

In the solid-state image pickup device in the example of the present embodiment having such a configuration, a gap 32 between the first transfer electrode 10a and the second transfer electrode 10b is covered by the light shielding dedicated electrode 41 on a side where the readout electrode 9 is not formed. The thus formed light shielding dedicated electrode 41 can prevent light from entering the charge transfer path 15 from the side of the gap 32 formed between the first transfer electrode 10a and the second transfer electrode 10b.

In addition, the first transfer electrode 10a, the second transfer electrode 10b, the light shielding dedicated electrode 41, and the readout electrode 9 are covered by the first wiring layer 44 and the second wiring layer 45 having a light shielding property. It is thus possible to prevent light from entering the charge transfer path 15 from above these electrodes.

In the solid-state image pickup device in the example of the present embodiment, a signal charge accumulated in the light receiving section 2 is read out through the readout gate section 16 to the charge transfer path 15 by applying a readout voltage to the readout electrode 9 via the first wiring layer 44. A vertical transfer register 3 performs four-phase driving by supplying for example a four-phase driving voltage to each of the first transfer electrode 10a and the second transfer electrode 10b. Thereby, the signal charge read out to the charge transfer path 15 is transferred in the vertical direction.

The solid-state image pickup device in the example of the present embodiment can provide similar effects to those of the first and second embodiments.

6. Sixth Embodiment

Solid-State Image Pickup Device

Figure 15A:
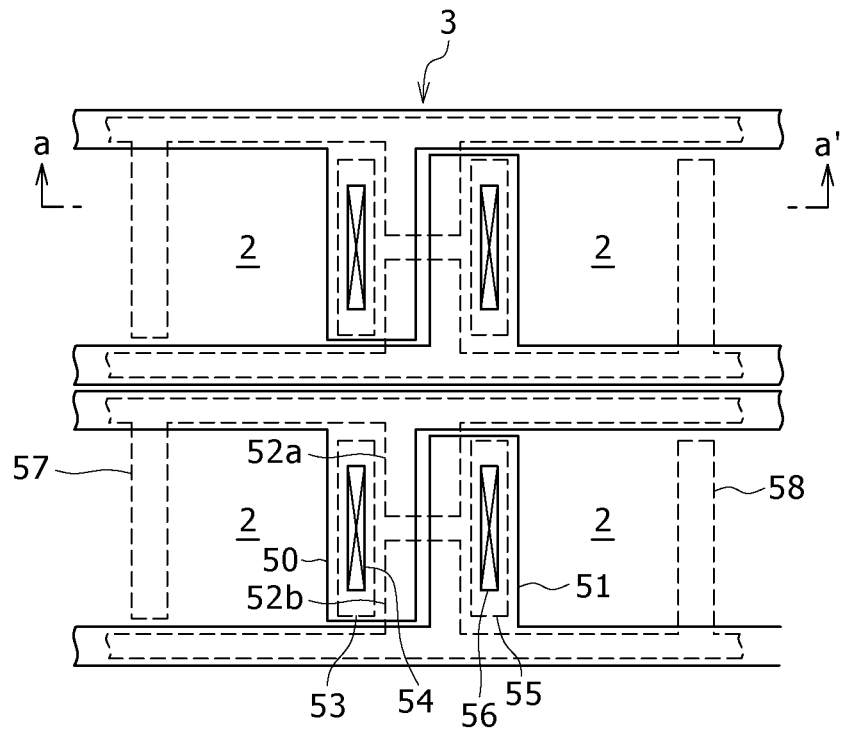
FIGS. 15A and 15B are a schematic plan configuration diagram of principal parts of a solid-state image pickup device according to a sixth embodiment of the present invention and a sectional configuration diagram taken along a line a-a' in FIG. 15A.
Figure 15B:
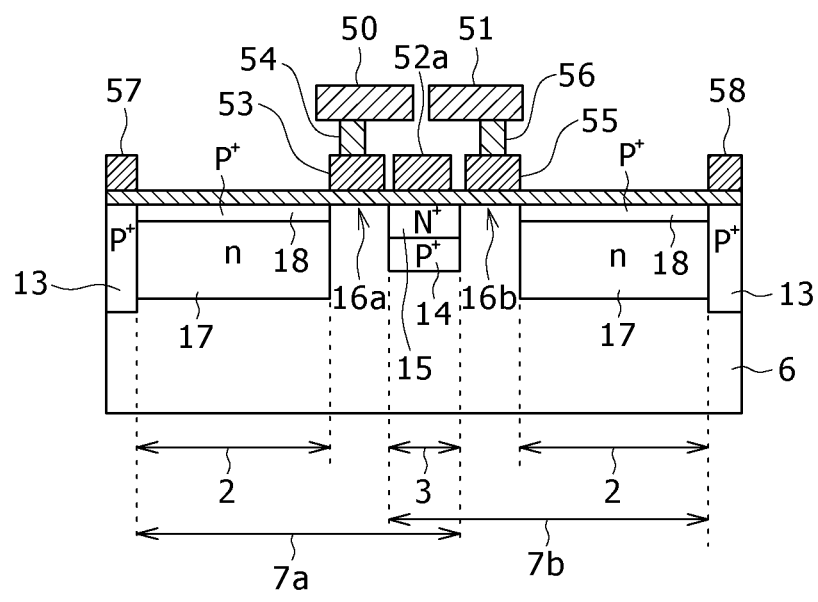

A solid-state image pickup device according to a sixth embodiment of the present invention will next be described. FIG. 15A shows a schematic plan configuration of the solid-state image pickup device in the example of the present embodiment. FIG. 15B is a sectional configuration diagram taken along a line a-a' in FIG. 15A. In FIGS. 15A and 15B, parts corresponding to those of FIGS. 2A and 2B are identified by the same reference symbols, and repeated description thereof will be omitted. In addition, the configuration of the whole of the example of the present embodiment has one vertical transfer register 3 for every two lines in FIG. 1, but is otherwise similar to FIG. 1. Thus, the configuration of the whole of the example of the present embodiment is not shown, and repeated description thereof will be omitted.

In the solid-state image pickup device in the example of the present embodiment, two pixels 7a and 7b adjacent to each other in a horizontal direction with a vertical transfer register 3 interposed between the pixels 7a and 7b are formed so as to share the vertical transfer register 3. The pixel 7a includes a light receiving section 2, a charge transfer path 15, and a readout gate section 16 as well as a first transfer electrode 52a, a second transfer electrode 52b, and a readout electrode 53 formed on a substrate 6. The other pixel 7b includes a light receiving section 2, the charge transfer path 15, and a readout gate section 16 formed in the substrate 6 as well as the first transfer electrode 52a, the second transfer electrode 52b, and a readout electrode 55 formed on the substrate 6. In addition, a first wiring layer 50 and a second wiring layer 51 are formed over the first transfer electrode 52a, the second transfer electrode 52b, and the readout electrodes 53 and 55. In the example of the present embodiment, as shown in FIG. 15B, the two pixels 7a and 7b adjacent to each other in the horizontal direction share the charge transfer path 15. In the following description, when the pixels 7a and 7b are not distinguished from each other, the pixels 7a and 7b will be described as a pixel 7.

Figure 16A:
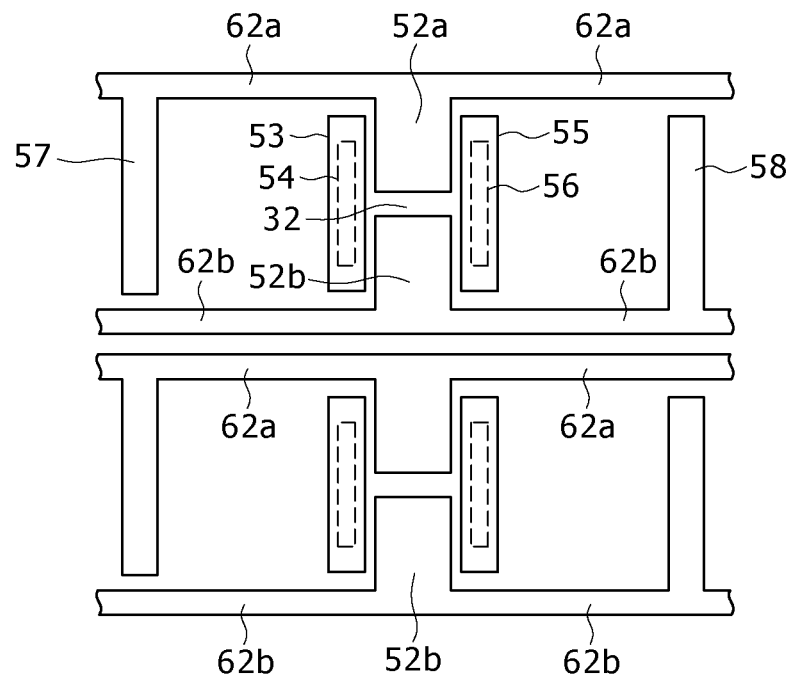
FIGS. 16A and 16B are a plan configuration diagram of only a first transfer electrode, a second transfer electrode, and a readout electrode and a plan configuration diagram of only a wiring layer.
Figure 16B:
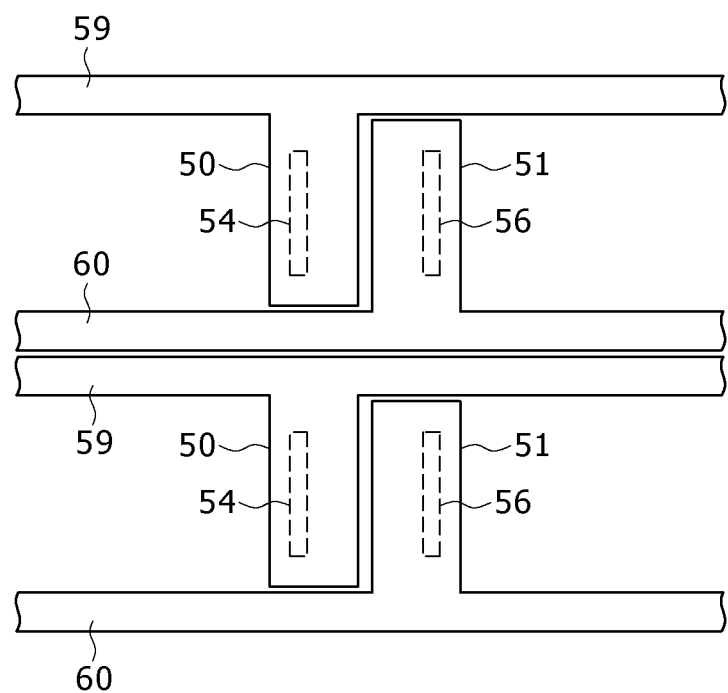

FIG. 16A is a schematic plan configuration diagram showing only the first transfer electrode 52a, the second transfer electrode 52b, and the readout electrodes 53 and 55. FIG. 16B is a schematic plan configuration diagram showing only the first wiring layer 50 and the second wiring layer 51.

The first transfer electrode 52a and the second transfer electrode 52b are formed in order above the charge transfer path 15 formed between the two pixels 7a and 7b adjacent to each other. The first transfer electrode 52a is connected to a first transfer electrode 52a not shown in the figure which electrode forms pixels 7 in the same row by a wiring section 62a. The second transfer electrode 52b is connected to a second transfer electrode 52b not shown in the figure which electrode forms the pixels 7 in the same row by a wiring section 62b. In addition, in the pixel 7a, a light shielding dedicated electrode 57 connected to the wiring section 62a identical with the first transfer electrode 52a of each pixel is formed above an element isolation region 13 formed in a region opposed to a region formed as a readout gate section 16a with the light receiving section 2 interposed between the regions. In addition, in the pixel 7b, a light shielding dedicated electrode 58 connected to the wiring section 62b identical with the second transfer electrode 52b of each pixel is formed above an element isolation region 13 formed in a region opposed to a region formed as a readout gate section 16b with the light receiving section 2 interposed between the regions.

That is, the light shielding dedicated electrode 57 or 58 is formed integrally with the first transfer electrode 52a or the second transfer electrode 52b, respectively.

The readout electrode 53 is formed above the readout gate section 16a formed between the light receiving section 2 and the charge transfer path 15 forming the pixel 7a. The readout electrode 55 is formed above the readout gate section 16b formed between the light receiving section 2 and the charge transfer path 15 forming the pixel 7b.

As shown in FIG. 15B, the first wiring layer 50 and the second wiring layer 51 are formed above the first transfer electrode 52a, the second transfer electrode 52b, and the readout electrodes 53 and 55 via an interlayer insulating film not shown in the figure. The first wiring layer 50 is formed so as to cover mainly the readout electrode 53 forming the pixel 7a on one side. The second wiring layer 51 is formed so as to cover mainly the readout electrode 55 forming the pixel 7b on the other side. The first wiring layer 50 is connected to the readout electrode 53 forming the pixel 7a via a contact part 54. The second wiring layer 51 is connected to the readout electrode 55 forming the pixel 7b via a contact part 56. In addition, as shown in FIG. 16B, the first wiring layer 50 is connected to a first wiring layer 50 forming pixels 7a and 7b in the same row by a wiring section 59, and the second wiring layer 51 is connected to a second wiring layer 51 forming the pixels 7a and 7b in the same row by a wiring section 60.

Also in the example of the present embodiment, the first transfer electrode 52a, the second transfer electrode 52b, and the readout electrodes 53 and 55 formed independently of each other in the same single layer are formed by an electrode material having a light shielding property. Applicable as the electrode material are for example W (tungsten), Ti (titanium), Cu (copper), and Ta (tantalum), compounds thereof, and oxides, nitrides, or silicides thereof. The first transfer electrode 52a, the second transfer electrode 52b, and the readout electrodes 53 and 55 thus formed in the same single layer can be formed by a manufacturing method similar to that of the first embodiment. That is, also in the example of the present embodiment, variations in the positional relation, line width and the like of the first transfer electrode 52a, the second transfer electrode 52b, and the readout electrodes 53 and 55 can be reduced by simultaneously forming the first transfer electrode 52a, the second transfer electrode 52b, and the readout electrodes 53 and 55 by one time of patterning.

Further, also in the example of the present embodiment, the first wiring layer 50 and the second wiring layer 51 are formed by a wiring material having a light shielding property. In the example of the present embodiment, a desired readout voltage is supplied via the first wiring layer 50 to the readout electrode 53 forming the pixel 7a of the pixels 7a and 7b adjacent to each other in the horizontal direction. A desired readout voltage is supplied via the second wiring layer 51 to the readout electrode 55 forming the other pixel 7b.

In the example of the present embodiment, in desired timing, a readout voltage is supplied via the first wiring layer 50 to the readout electrode 53 forming the pixel 7a of the two pixels 7a and 7b adjacent to each other in the horizontal direction. Thereby, a signal charge accumulated in the light receiving section 2 of one pixel 7a is read out through the readout gate section 16a to the charge transfer path 15. In addition, in timing different from timing in which the signal charge of one pixel 7a is read out, a readout voltage is supplied via the second wiring layer 51 to the readout electrode 55 forming the other pixel 7. Thereby, a signal charge accumulated in the light receiving section 2 of the other pixel 7b is read out through the readout gate section 16b to the charge transfer path 15. A vertical transfer register 3 performs four-phase driving by supplying for example a four-phase driving voltage to each of the first transfer electrode 52a and the second transfer electrode 52b. Thereby, the signal charge read out to the charge transfer path 15 is transferred in the vertical direction.

In the solid-state image pickup device in the example of the present embodiment, two pixels adjacent to each other in the horizontal direction share a charge transfer path 15, and therefore a total number of charge transfer paths 15 can be reduced. Thus, because an area used by the charge transfer paths 15 can be reduced, the area of the light receiving section 2 can be increased. In addition, the light shielding dedicated electrodes 57 and 58 made of an electrode material having a light shielding property are formed between adjacent pixels on an opposite side from a side where the readout electrodes 53 and 55 are formed. Therefore color mixture between the adjacent pixels is reduced.

Other effects similar to those of the first embodiment can be obtained.

7. Seventh Embodiment

Solid-State Image Pickup Device

Figure 17A:
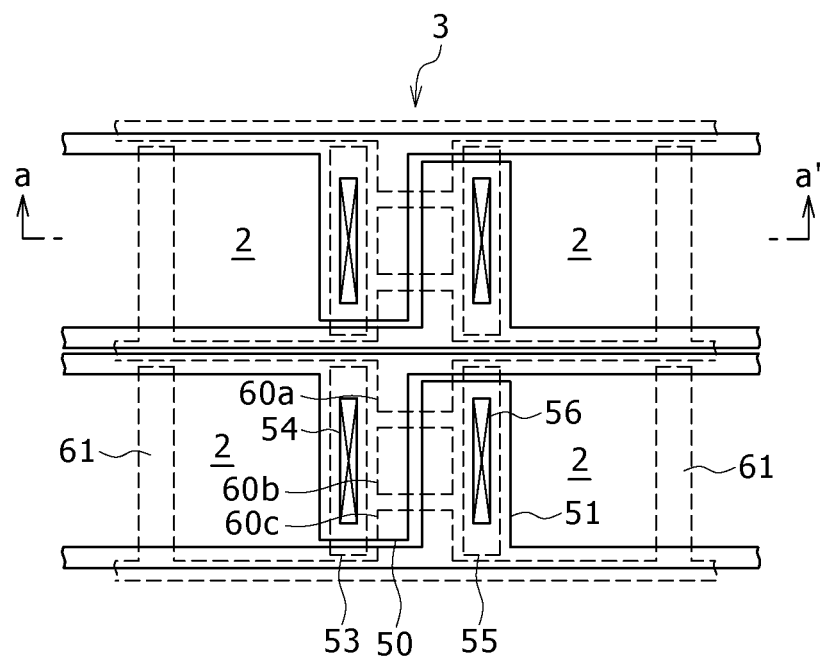
FIGS. 17A and 17B are a schematic plan configuration diagram of principal parts of a solid-state image pickup device according to a seventh embodiment of the present invention and a sectional configuration diagram taken along a line a-a' in FIG. 17A.
Figure 17B:
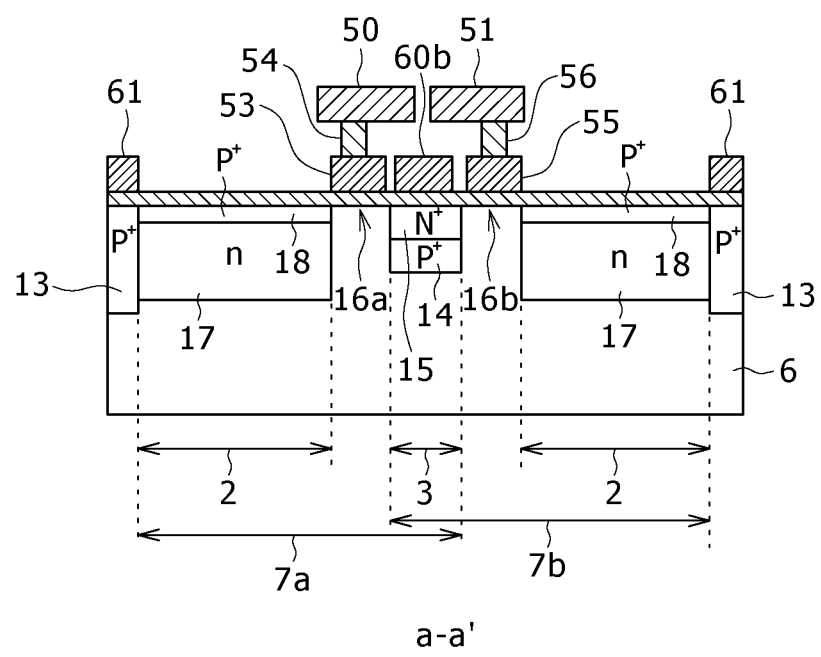

A solid-state image pickup device according to a seventh embodiment of the present invention will next be described. FIG. 17A shows a schematic plan configuration of the solid-state image pickup device in the example of the present embodiment. FIG. 17B is a sectional configuration diagram taken along a line a-a' in FIG. 17A. In FIGS. 17A and 17B, parts corresponding to those of FIGS. 2A and 2B are identified by the same reference symbols, and repeated description thereof will be omitted. In addition, the configuration of the whole of the example of the present embodiment has one vertical transfer register 3 for every two lines in FIG. 1, but is otherwise similar to FIG. 1. Thus, the configuration of the whole of the example of the present embodiment is not shown, and repeated description thereof will be omitted.

In the solid-state image pickup device in the example of the present embodiment, two pixels 7a and 7b adjacent to each other in a horizontal direction with a vertical transfer register 3 interposed between the pixels 7a and 7b are formed so as to share the vertical transfer register 3. The pixel 7a includes a light receiving section 2, a charge transfer path 15, and a readout gate section 16a as well as a first to a third transfer electrode 60a to 60c and a readout electrode 53 formed on a substrate 6. The other pixel 7b includes a light receiving section 2, the charge transfer path 15, and a readout gate section 16b formed in the substrate 6 as well as the first to third transfer electrodes 60a to 60c and a readout electrode 55 formed on the substrate 6. In addition, a first wiring layer 50 and a second wiring layer 51 are formed over the first to third transfer electrodes 60a to 60c and the readout electrodes 53 and 55. In the example of the present embodiment, as shown in FIG. 17B, the two pixels 7a and 7b adjacent to each other in the horizontal direction share the charge transfer path 15. In the following description, when the pixels 7a and 7b are not distinguished from each other, the pixels 7a and 7b will be described as a pixel 7.

Figure 18:
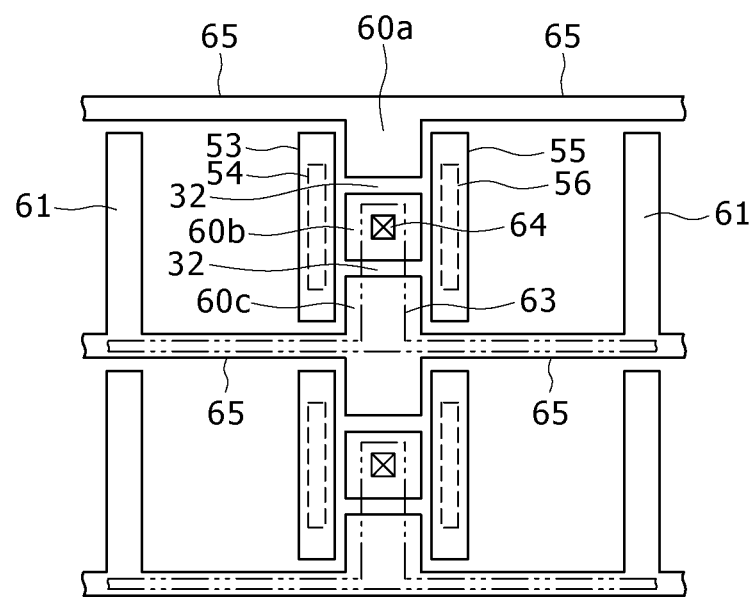
FIG. 18 is a plan configuration diagram of only a first to a third transfer electrode and a readout electrode.

FIG. 18 is a schematic plan configuration diagram showing only the first to third transfer electrodes 60a to 60c and the readout electrodes 53 and 55. Incidentally, the configuration of the first wiring layer 50 and the second wiring layer 51 is similar to FIG. 16B. Thus, the configuration of the first wiring layer 50 and the second wiring layer 51 is not shown, and repeated description thereof will be omitted.

As shown in FIG. 18, the first to third transfer electrodes 60a to 60c are formed in order in a vertical direction above the charge transfer path 15 formed between the two pixels 7a and 7b adjacent to each other. The second transfer electrode 60b is formed in the shape of a floating island between the first transfer electrode 60a and the third transfer electrode 60c independently of the first transfer electrode 60a and the third transfer electrode 60c. The first transfer electrode 60a is formed integrally with a third transfer electrode 60c forming another pixel 7 adjacent in the vertical direction, and is connected to a first transfer electrode 60a and a third transfer electrode 60c not shown in the figure which electrodes form pixels in the same rows by a wiring section 65. In addition, a light shielding dedicated electrode 61 formed integrally with the wiring section 65 identical with the third transfer electrode 60c of each pixel is formed above an element isolation region 13 formed in a region opposed to a region in which the readout gate section 16a or 16b is formed with the light receiving section 2 interposed between the regions.

Though not shown in FIG. 17A, as shown in FIG. 18, shunt wiring 63 is disposed in a layer above the second transfer electrode 60b via an interlayer insulating film, and the shunt wiring 63 is connected to the second transfer electrode 60b via a contact part 64. This shunt wiring 63 is formed so as to extend above the second transfer electrode 60b and the wiring section 65. The second transfer electrode 60b is electrically connected to a second transfer electrode 60b forming pixels 7a and 7b in the same row by the shunt wiring 63. In the example of the present embodiment, a desired transfer voltage is supplied to the second transfer electrode 60b via the shunt wiring 63.

As in the sixth embodiment, the readout electrodes 53 and 55 are formed above the readout gate sections 16a and 16b formed between the light receiving sections 2 and the charge transfer path 15.

Also in the example of the present embodiment, the first to third transfer electrodes 60a to 60c and the readout electrodes 53 and 55 formed independently of each other in a same single layer are formed by an electrode material having a light shielding property. Applicable as the electrode material are for example W (tungsten), Ti (titanium), Cu (copper), and Ta (tantalum), compounds thereof, and oxides, nitrides, or silicides thereof. The first to third transfer electrodes 60a to 60c and the readout electrodes 53 and 55 thus formed in the same single layer can be formed by a manufacturing method similar to that of the first embodiment. That is, also in the example of the present embodiment, variations in the positional relation, line width and the like of the first to third transfer electrodes 60a to 60c and the readout electrodes 53 and 55 can be reduced by simultaneously forming the first to third transfer electrodes 60a to 60c and the readout electrodes 53 and 55 by one time of patterning.

Also in the solid-state image pickup device in the example of the present embodiment having the above configuration, a signal charge generated in the light receiving section 2 is read out and transferred in the vertical direction by a driving method similar to that of the sixth embodiment. The solid-state image pickup device in the example of the present embodiment can provide similar effects to those of the first embodiment and the sixth embodiment.

8. Eighth Embodiment

Solid-State Image Pickup Device

Figure 19A:
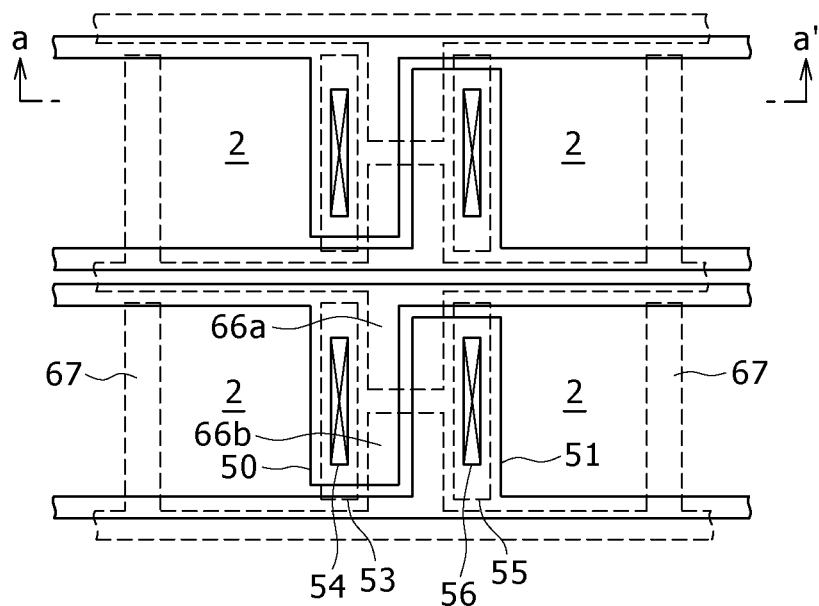
FIGS. 19A and 19B are a schematic plan configuration diagram of principal parts of a solid-state image pickup device according to an eighth embodiment of the present invention and a sectional configuration diagram taken along a line a-a' in FIG. 19A.
Figure 19B:
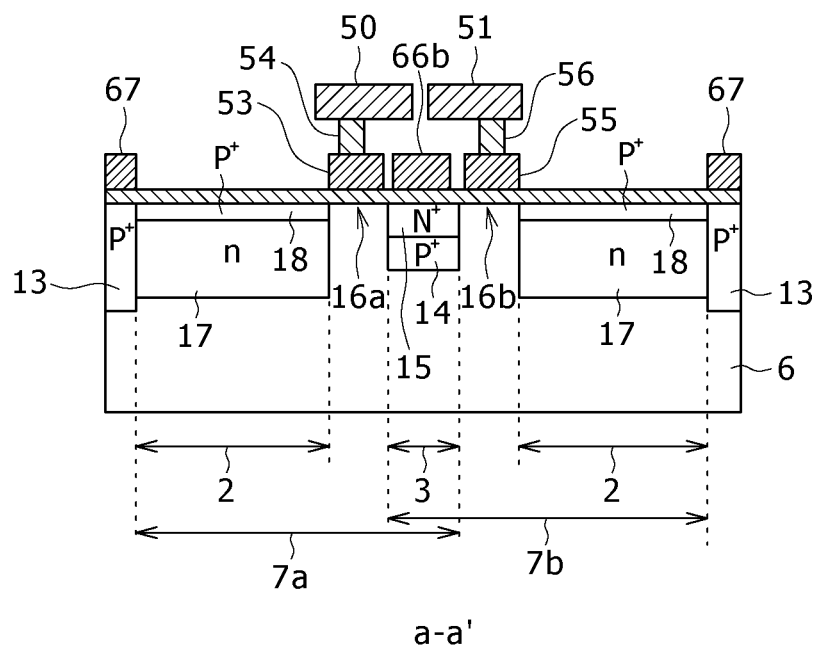

A solid-state image pickup device according to an eighth embodiment of the present invention will next be described. FIG. 19A shows a schematic plan configuration of the solid-state image pickup device in the example of the present embodiment. FIG. 19B is a sectional configuration diagram taken along a line a-a' in FIG. 19A. In FIGS. 19A and 19B, parts corresponding to those of FIGS. 2A and 2B are identified by the same reference symbols, and repeated description thereof will be omitted. In addition, the configuration of the whole of the example of the present embodiment has one vertical transfer register 3 for every two lines in FIG. 1, but is otherwise similar to FIG. 1. Thus, the configuration of the whole of the example of the present embodiment is not shown, and repeated description thereof will be omitted.

In the solid-state image pickup device in the example of the present embodiment, two pixels 7a and 7b adjacent to each other in a horizontal direction with a vertical transfer register 3 interposed between the pixels 7a and 7b are formed so as to share the vertical transfer register 3. The pixel 7a includes a light receiving section 2, a charge transfer path 15, and a readout gate section 16a formed in a substrate 6 as well as a first transfer electrode 66a, a second transfer electrode 66b, and a readout electrode 53 formed on the substrate 6. The pixel 7b includes a light receiving section 2, the charge transfer path 15, and a readout gate section 16b formed in the substrate 6 as well as the first transfer electrode 66a, second transfer electrode 66b, and a readout electrode 55 formed on the substrate 6. In addition, a first wiring layer 50 and a second wiring layer 51 are formed over the first transfer electrode 66a, the second transfer electrode 66b, and the readout electrodes 53 and 55. In the example of the present embodiment, as shown in FIG. 19B, the two pixels 7a and 7b adjacent to each other in the horizontal direction share the charge transfer path 15. In the following description, when the pixels 7a and 7b are not distinguished from each other, the pixels 7a and 7b will be described as a pixel 7.

Figure 20:
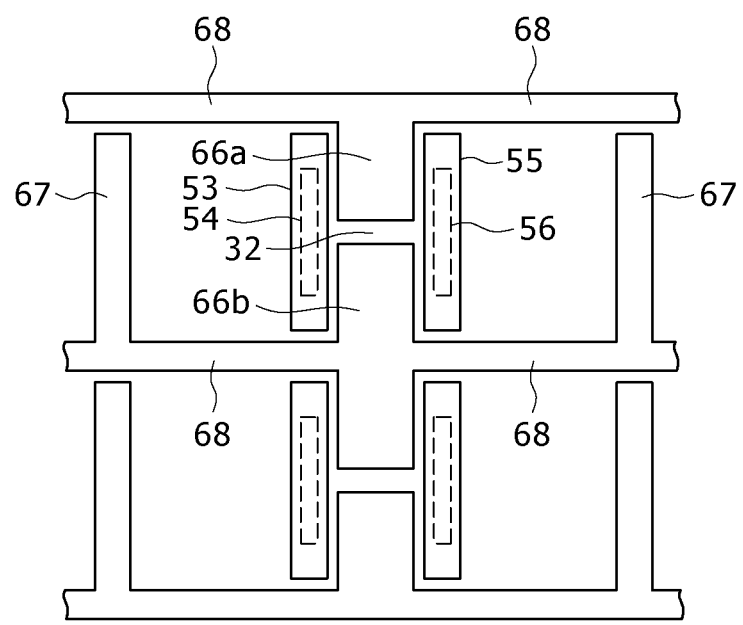
FIG. 20 is a plan configuration diagram of only a first transfer electrode, a second transfer electrode, and a readout electrode.

FIG. 20 is a schematic plan configuration diagram showing only the first transfer electrode 66a, the second transfer electrode 66b, and the readout electrodes 53 and 55. Incidentally, the configuration of the first wiring layer 50 and the second wiring layer 51 is similar to FIG. 16B, and thus repeated description thereof will be omitted.

As shown in FIG. 20, the first transfer electrode 66a and the second transfer electrode 66b are formed in order in a vertical direction above the charge transfer path 15 formed between the two pixels 7a and 7b adjacent to each other. In addition, the first transfer electrode 66a is formed integrally with a second transfer electrode 66b forming another pixel 7 adjacent in the vertical direction, and is connected to a first transfer electrode 66a and a second transfer electrode 66b not shown in the figure which electrodes form pixels in the same rows by a wiring section 68. In addition, a light shielding dedicated electrode 67 formed integrally with the wiring section 68 for connecting the second transfer electrode 66b forming each pixel 7 is formed above an element isolation region 13 formed in a region opposed to a region in which the readout gate section 16a or 16b is formed with the light receiving section 2 interposed between the regions. That is, the light shielding dedicated electrode 67 is formed integrally with the first transfer electrode 66a and the second transfer electrode 66b by the wiring section 68.

As in the sixth embodiment, the readout electrodes 53 and 55 are formed above the readout gate sections 16a and 16b formed between the light receiving sections 2 and the charge transfer path 15 with an insulating film 8 interposed between the readout electrodes 53 and 55 and the readout gate sections 16a and 16b.

Also in the example of the present embodiment, the first transfer electrode 66a, the second transfer electrode 66b, and the readout electrodes 53 and 55 formed independently of each other in a same single layer are formed by an electrode material having a light shielding property. Applicable as the electrode material are for example W (tungsten), Ti (titanium), Cu (copper), and Ta (tantalum), compounds thereof, and oxides, nitrides, or silicides thereof. The first transfer electrode 66a, the second transfer electrode 66b, and the readout electrodes 53 and 55 thus formed in the same single layer can be formed by a manufacturing method similar to that of the first embodiment. That is, also in the example of the present embodiment, variations in the positional relation, line width and the like of the first transfer electrode 66a, the second transfer electrode 66b, and the readout electrodes 53 and 55 can be reduced by simultaneously forming the first transfer electrode 66a, the second transfer electrode 66b, and the readout electrodes 53 and 55 by one time of patterning.

Also in the solid-state image pickup device in the example of the present embodiment having the above configuration, a signal charge generated in the light receiving section 2 is read out and transferred in the vertical direction by a driving method similar to that of the sixth embodiment. The solid-state image pickup device in the example of the present embodiment can provide similar effects to those of the first embodiment and the sixth embodiment.

9. Ninth Embodiment

Solid-State Image Pickup Device

Figure 21A:
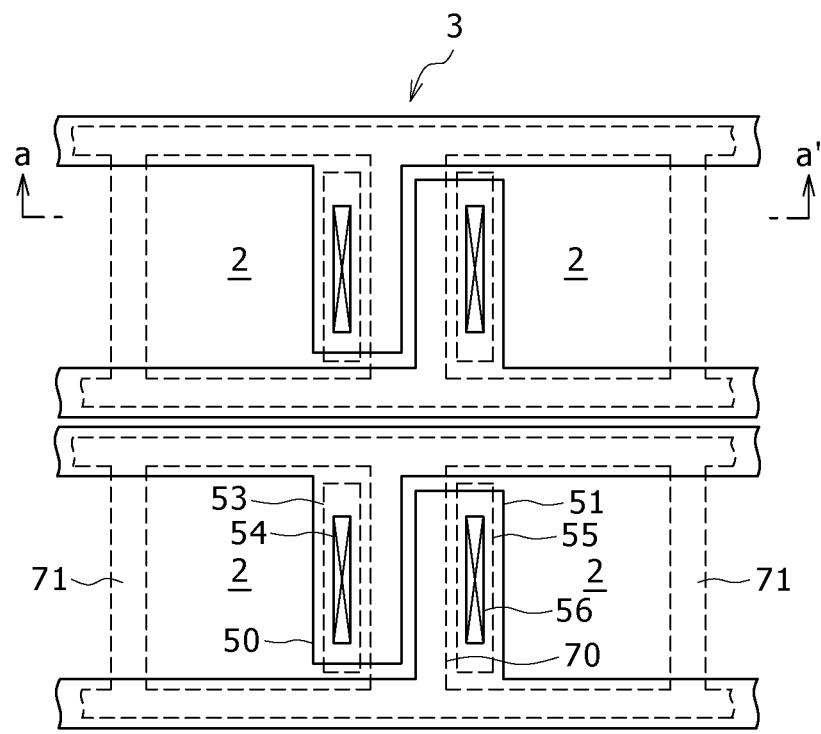
FIGS. 21A and 21B are a schematic plan configuration diagram of principal parts of a solid-state image pickup device according to a ninth embodiment of the present invention and a sectional configuration diagram taken along a line a-a' in FIG. 21A.
Figure 21B:
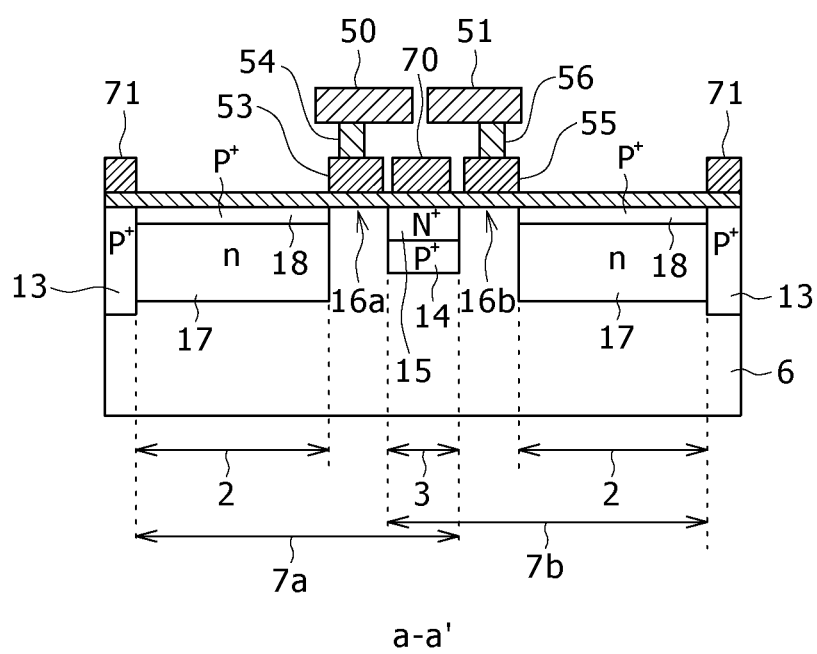

A solid-state image pickup device according to a ninth embodiment of the present invention will next be described. FIG. 21A shows a schematic plan configuration of the solid-state image pickup device in the example of the present embodiment. FIG. 21B is a sectional configuration diagram taken along a line a-a' in FIG. 21A. In FIGS. 21A and 21B, parts corresponding to those of FIGS. 2A and 2B are identified by the same reference symbols, and repeated description thereof will be omitted. In addition, the configuration of the whole of the example of the present embodiment has one vertical transfer register 3 for every two lines in FIG. 1, but is otherwise similar to FIG. 1. Thus, the configuration of the whole of the example of the present embodiment is not shown, and repeated description thereof will be omitted.

In the solid-state image pickup device in the example of the present embodiment, two pixels 7a and 7b adjacent to each other in a horizontal direction with a vertical transfer register 3 interposed between the pixels 7a and 7b are formed so as to share the vertical transfer register 3. The pixel 7a includes a light receiving section 2, a charge transfer path 15, and a readout gate section 16a formed in a substrate 6 as well as a transfer electrode 70 and a readout electrode 53 formed on the substrate 6. The pixel 7b includes a light receiving section 2, the charge transfer path 15, and a readout gate section 16b formed in the substrate 6 as well as the transfer electrode 70 and a readout electrode 55 formed on the substrate 6. In addition, a first wiring layer 50 and a second wiring layer 51 are formed over the transfer electrode 70 and the readout electrodes 53 and 55. In the example of the present embodiment, as shown in FIG. 21B, the two pixels 7a and 7b adjacent to each other in the horizontal direction share the charge transfer path 15. In the following description, when the pixels 7a and 7b are not distinguished from each other, the pixels 7a and 7b will be described as a pixel 7.

Figure 22:
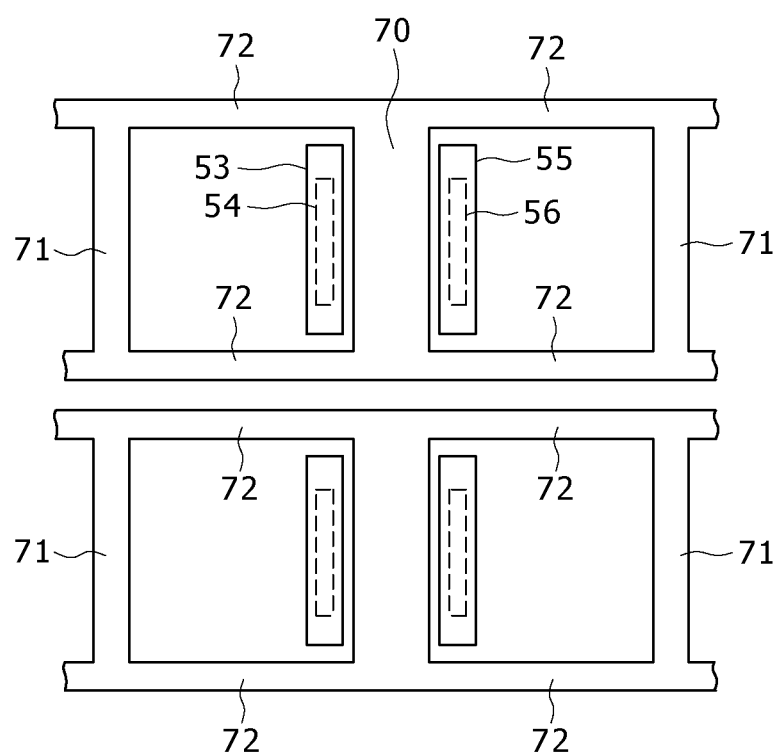
FIG. 22 is a plan configuration diagram of only a transfer electrode and a readout electrode.

FIG. 22 shows a schematic plan configuration of only the transfer electrode 70 and the readout electrodes 53 and 55. Incidentally, the configuration of the first wiring layer 50 and the second wiring layer 51 is similar to FIG. 16B. Thus, the configuration of the first wiring layer 50 and the second wiring layer 51 is not shown, and repeated description thereof will be omitted.

As shown in FIG. 22, the transfer electrode 70 is formed in a vertical direction above the charge transfer path 15 formed between the two pixels 7a and 7b adjacent to each other. In addition, the transfer electrode 70 is connected to a transfer electrode 70 not shown in the figure which electrode forms pixels in the same row by a wiring section 72 disposed on both sides of the light receiving section 2. In addition, a light shielding dedicated electrode 71 connected the wiring section 72 identical with the transfer electrode 70 of each of the pixels 7a and 7b is formed above an element isolation region 13 formed in a region opposed to a region in which the readout gate section 16a or 16b is formed with the light receiving section 2 interposed between the regions. That is, the light shielding dedicated electrode 71 is formed integrally with the transfer electrode 70 by the wiring section 72. Thus, in the example of the present embodiment, a region having the light receiving section 2 formed therein in one pixel 7 is surrounded on four sides by the transfer electrode 70, the wiring section 72, and the light shielding dedicated electrode 71.

As in the sixth embodiment, the readout electrodes 53 and 55 are formed above the readout gate sections 16a and 16b formed between the light receiving sections 2 and the charge transfer path 15.

Also in the example of the present embodiment, the transfer electrode 70 and the readout electrodes 53 and 55 formed independently of each other in a same single layer are formed by an electrode material having a light shielding property. Applicable as the electrode material are for example W (tungsten), Ti (titanium), Cu (copper), and Ta (tantalum), compounds thereof, and oxides, nitrides, or silicides thereof. The transfer electrode 70 and the readout electrodes 53 and 55 thus formed in the same single layer can be formed by a manufacturing method similar to that of the first embodiment. That is, also in the example of the present embodiment, variations in the positional relation, line width and the like of the transfer electrode 70 and the readout electrodes 53 and 55 can be reduced by simultaneously forming the transfer electrode 70 and the readout electrodes 53 and 55 by one time of patterning.

Also in the solid-state image pickup device in the example of the present embodiment having the above configuration, a signal charge generated in the light receiving section 2 is read out and transferred in the vertical direction by a driving method similar to that of the sixth embodiment. The solid-state image pickup device in the example of the present embodiment can provide similar effects to those of the first embodiment and the sixth embodiment.

10. Tenth Embodiment

Solid-State Image Pickup Device

Figure 23A:
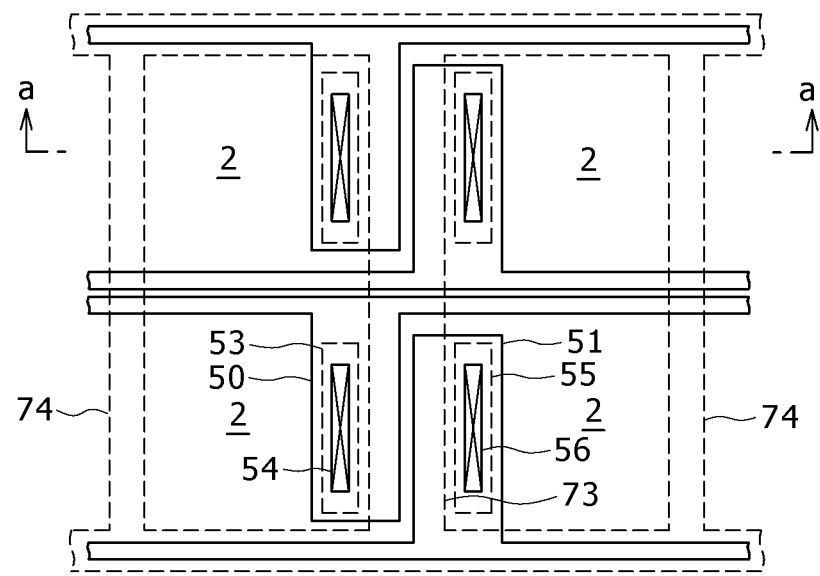
FIGS. 23A and 23B are a schematic plan configuration diagram of principal parts of a solid-state image pickup device according to a tenth embodiment of the present invention and a sectional configuration diagram taken along a line a-a' in FIG. 23A.
Figure 23B:
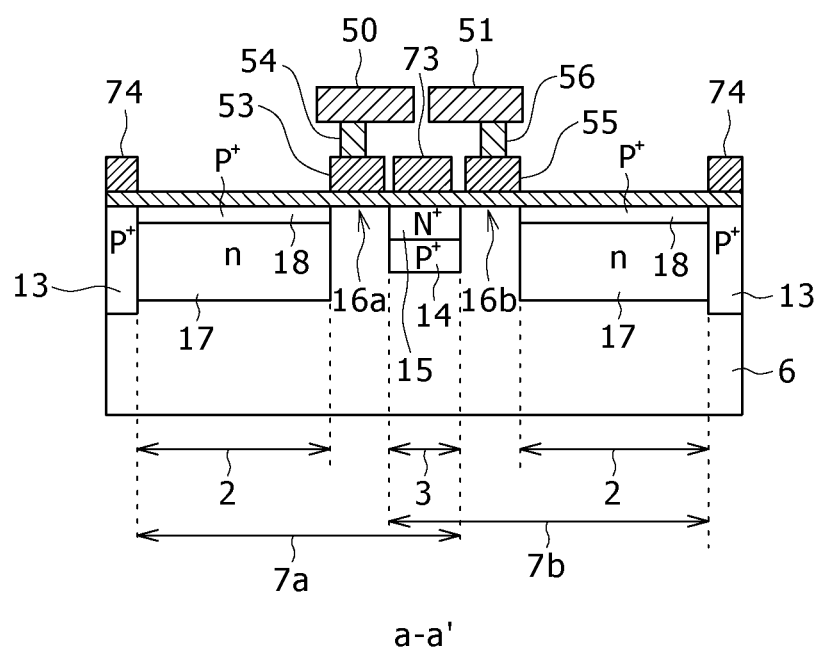

A solid-state image pickup device according to a tenth embodiment of the present invention will next be described. FIG. 23A shows a schematic plan configuration of the solid-state image pickup device in the example of the present embodiment. FIG. 23B is a sectional configuration diagram taken along a line a-a' in FIG. 23A. In FIGS. 23A and 23B, parts corresponding to those of FIGS. 2A and 2B are identified by the same reference symbols, and repeated description thereof will be omitted. In addition, the configuration of the whole of the example of the present embodiment has one vertical transfer register 3 for every two lines in FIG. 1, but is otherwise similar to FIG. 1. Thus, the configuration of the whole of the example of the present embodiment is not shown, and repeated description thereof will be omitted.

In the solid-state image pickup device in the example of the present embodiment, two pixels 7a and 7b adjacent to each other in a horizontal direction with a vertical transfer register 3 interposed between the pixels 7a and 7b are formed so as to share the vertical transfer register 3. The pixel 7a includes a light receiving section 2, a charge transfer path 15, and a readout gate section 16a formed in a substrate 6 as well as a transfer electrode 73 and a readout electrode 53 formed on the substrate 6. The pixel 7b includes a light receiving section 2, the charge transfer path 15, and a readout gate section 16b formed in the substrate 6 as well as the transfer electrode 73 and a readout electrode 55 formed on the substrate 6. In addition, a first wiring layer 50 and a second wiring layer 51 are formed over the transfer electrode 73 and the readout electrodes 53 and 55. In the example of the present embodiment, as shown in FIG. 23B, the two pixels 7a and 7b adjacent to each other in the horizontal direction share the charge transfer path 15. In the following description, when the pixels 7a and 7b are not distinguished from each other, the pixels 7a and 7b will be described as a pixel 7.

Figure 24:
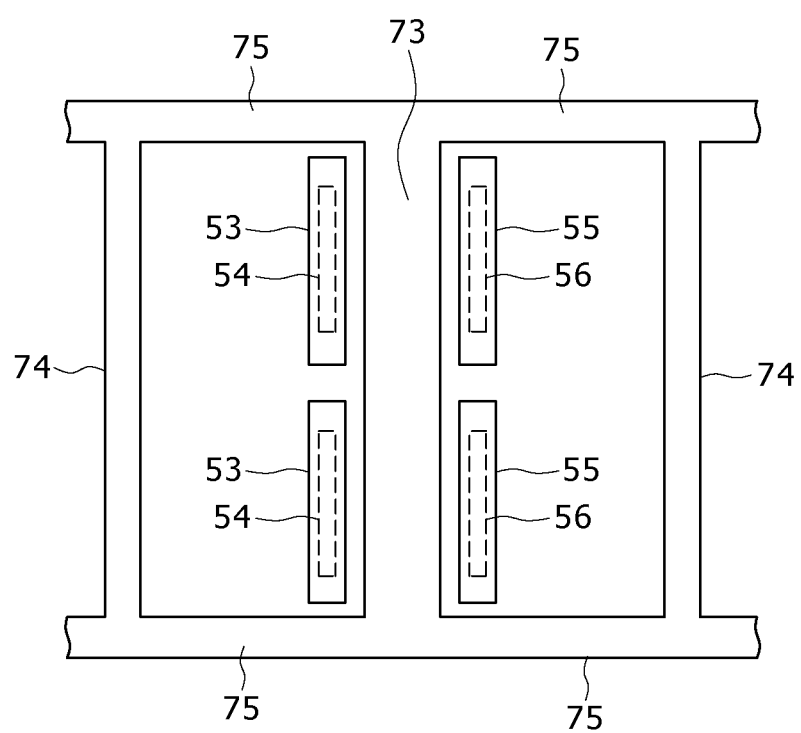
FIG. 24 is a plan configuration diagram of only a transfer electrode and a readout electrode.

FIG. 24 shows a schematic plan configuration of only the transfer electrode 73 and the readout electrodes 53 and 55. Incidentally, the configuration of the first wiring layer 50 and the second wiring layer 51 is similar to FIG. 16B. Thus, the configuration of the first wiring layer 50 and the second wiring layer 51 is not shown, and repeated description thereof will be omitted.

As shown in FIG. 23B and FIG. 24, the transfer electrode 73 is formed in a vertical direction above the charge transfer path 15 formed between the two pixels 7a and 7b adjacent to each other in a horizontal direction, and is formed on a one-by-one basis over two pixels 7 adjacent to each other in the vertical direction. That is, in the example of the present embodiment, the transfer electrode 73 is shared by the four pixels 7 adjacent to each other in the vertical direction and the horizontal direction. In addition, the transfer electrode 73 is connected to a transfer electrode 73 not shown in the figure which electrode forms pixels in the same rows by two opposed wiring sections 75 formed between pixels 7 adjacent to each other in the vertical direction. A light shielding dedicated electrode 74 formed integrally with the wiring section 75 identical with the transfer electrode 73 of each pixel 7 is formed above an element isolation region 13 formed in a region opposed to a region in which the readout gate section 16a or 16b is formed with the light receiving section 2 interposed between the regions. That is, the light shielding dedicated electrode 74 is formed integrally with the transfer electrode 73 by the wiring section 75. Thus, in the example of the present embodiment, a region having light receiving sections 2 formed therein in the two pixels 7 adjacent to each other in the vertical direction is surrounded on four sides by the transfer electrode 73, the wiring section 75, and the light shielding dedicated electrode 74.

As in the sixth embodiment, the readout electrodes 53 and 55 are formed above the readout gate sections 16a and 16b formed between the light receiving sections 2 and the charge transfer path 15 with an insulating film 8 interposed between the readout electrodes 53 and 55 and the readout gate sections 16a and 16b.

Also in the example of the present embodiment, the transfer electrode 73 and the readout electrodes 53 and 55 formed independently of each other in a same single layer are formed by an electrode material having a light shielding property. Applicable as the electrode material are for example W (tungsten), Ti (titanium), Cu (copper), and Ta (tantalum), compounds thereof, and oxides, nitrides, or silicides thereof. The transfer electrode 73 and the readout electrodes 53 and 55 thus formed in the same single layer can be formed by a manufacturing method similar to that of the first embodiment. That is, also in the example of the present embodiment, variations in the positional relation, line width and the like of the transfer electrode 73 and the readout electrodes 53 and 55 can be reduced by simultaneously forming the transfer electrode 73 and the readout electrodes 53 and 55 by one time of patterning.

Also in the solid-state image pickup device in the example of the present embodiment having the above configuration, a signal charge generated in the light receiving section 2 is read out and transferred in the vertical direction by a driving method similar to that of the sixth embodiment. The example of the present embodiment reduces the number of transfer electrodes, and can thereby improve a transfer rate at which a signal charge is transferred from the charge transfer path 15 forming the vertical transfer register 3 to a charge transfer path forming a horizontal transfer register. The solid-state image pickup device in the example of the present embodiment can provide similar effects to those of the first embodiment and the sixth embodiment.

11. Eleventh Embodiment

Solid-State Image Pickup Device

Figure 25A:
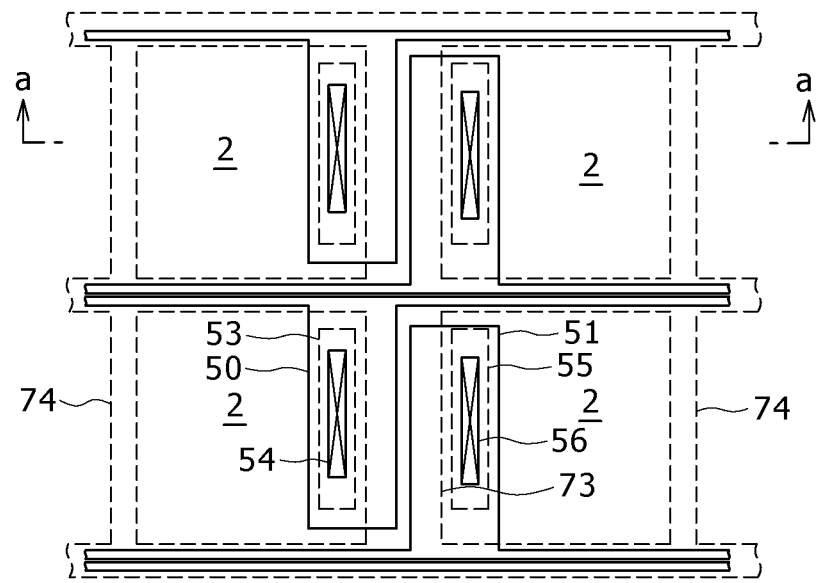
FIGS. 25A and 25B are a schematic plan configuration diagram of principal parts of a solid-state image pickup device according to an eleventh embodiment of the present invention and a sectional configuration diagram taken along a line a-a' in FIG. 25A.
Figure 25B:
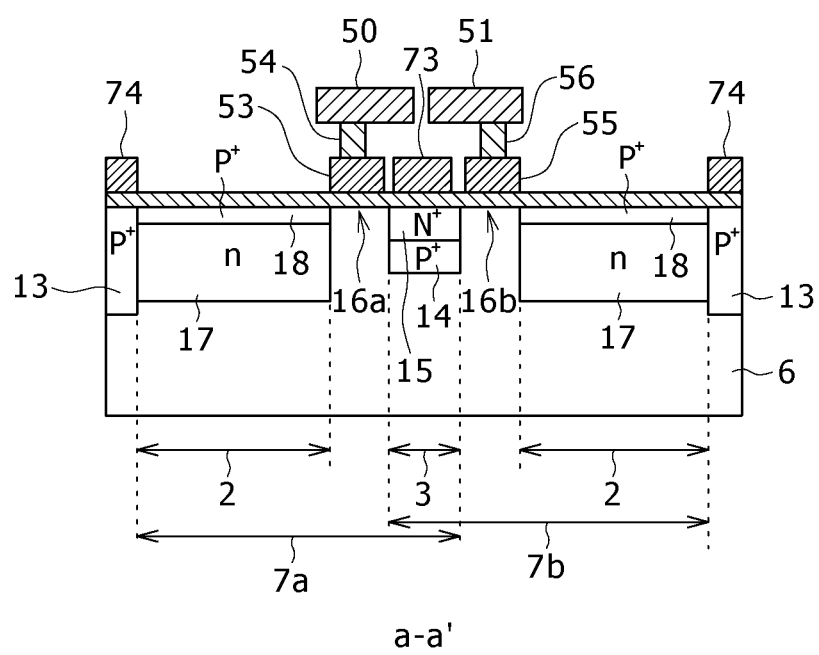

A solid-state image pickup device according to an eleventh embodiment of the present invention will next be described. FIG. 25A shows a schematic plan configuration of the solid-state image pickup device in the example of the present embodiment. FIG. 25B is a sectional configuration diagram taken along a line a-a' in FIG. 25A. In FIGS. 25A and 25B, parts corresponding to those of FIGS. 2A and 2B are identified by the same reference symbols, and repeated description thereof will be omitted. In addition, the configuration of the whole of the example of the present embodiment has one vertical transfer register 3 for every two lines in FIG. 1, but is otherwise similar to FIG. 1. Thus, the configuration of the whole of the example of the present embodiment is not shown, and repeated description thereof will be omitted.

In the solid-state image pickup device in the example of the present embodiment, two pixels 7a and 7b adjacent to each other in a horizontal direction with a vertical transfer register 3 interposed between the pixels 7a and 7b are formed so as to share the vertical transfer register 3. The pixel 7a includes a light receiving section 2, a charge transfer path 15, and a readout gate section 16a formed in a substrate 6 as well as a transfer electrode 73 and a readout electrode 53 formed on the substrate 6. The pixel 7b includes a light receiving section 2, the charge transfer path 15, and a readout gate section 16b formed in the substrate 6 as well as the transfer electrode 73 and a readout electrode 55 formed on the substrate 6. In addition, a first wiring layer 50 and a second wiring layer 51 are formed over the transfer electrode 73 and the readout electrodes 53 and 55. In the example of the present embodiment, as shown in FIG. 25B, the two pixels 7a and 7b adjacent to each other in the horizontal direction share the charge transfer path 15. In the following description, when the pixels 7a and 7b are not distinguished from each other, the pixels 7a and 7b will be described as a pixel 7.

Figure 26:
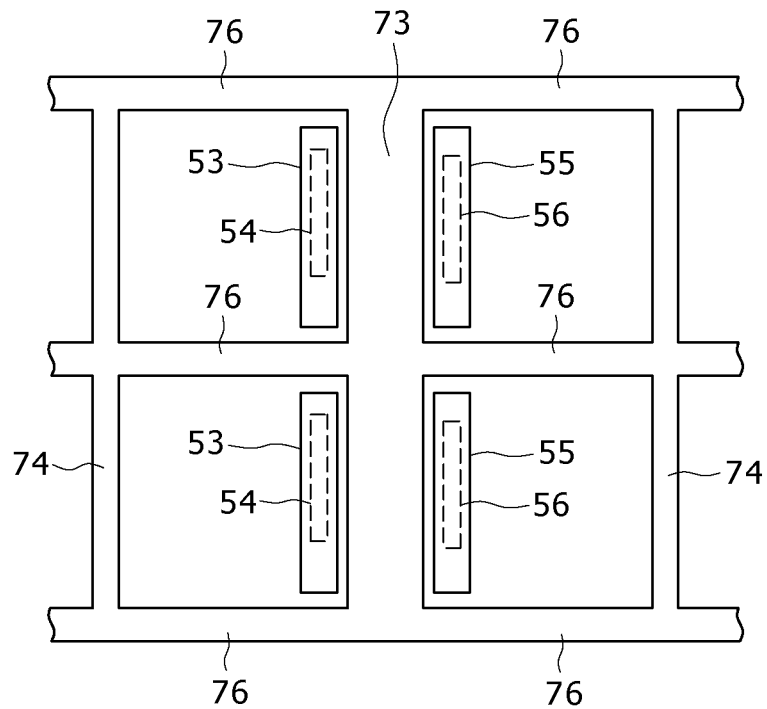
FIG. 26 is a plan configuration diagram of only a transfer electrode and a readout electrode.

FIG. 26 shows a schematic plan configuration of only the transfer electrode 73 and the readout electrodes 53 and 55. Incidentally, the configuration of the first wiring layer 50 and the second wiring layer 51 is similar to FIG. 16B. Thus, the configuration of the first wiring layer 50 and the second wiring layer 51 is not shown, and repeated description thereof will be omitted.

As shown in FIG. 25B and FIG. 26, the transfer electrode 73 is formed in a vertical direction above the charge transfer path 15 formed between the two pixels 7a and 7b adjacent to each other in a horizontal direction, and is formed on a one-by-one basis over two pixels 7 adjacent to each other in the vertical direction. That is, in the example of the present embodiment, the transfer electrode 73 is shared by the four pixels adjacent to each other in the vertical direction and the horizontal direction. In addition, the transfer electrode 73 is connected to a wiring section 76 disposed in the horizontal direction in each row between pixels adjacent to each other in the vertical direction. A light shielding dedicated electrode 74 formed integrally with the wiring section 76 identical with the transfer electrode 73 of each pixel 7 is formed above an element isolation region 13 formed in a region opposed to a region in which the readout gate section 16a or 16b is formed with the light receiving section 2 interposed between the regions. Thus, a region having the light receiving section 2 formed therein in the pixel 7 in the example of the present embodiment is surrounded on four sides by the transfer electrode 73, the wiring section 76, and the light shielding dedicated electrode 74.

As in the sixth embodiment, the readout electrodes 53 and 55 are respectively formed above the readout gate sections 16a and 16b formed between the light receiving sections 2 and the charge transfer path 15.

Also in the example of the present embodiment, the transfer electrode 73 and the readout electrodes 53 and 55 formed independently of each other in a same single layer are formed by an electrode material having a light shielding property. Applicable as the electrode material are for example W (tungsten), Ti (titanium), Cu (copper), and Ta (tantalum), compounds thereof, and oxides, nitrides, or silicides thereof. The transfer electrode 73 and the readout electrodes 53 and 55 thus formed in the same single layer can be formed by a manufacturing method similar to that of the first embodiment. That is, also in the example of the present embodiment, variations in the positional relation, line width and the like of the transfer electrode 73 and the readout electrodes 53 and 55 can be reduced by simultaneously forming the transfer electrode 73 and the readout electrodes 53 and 55 by one time of patterning.

Also in the solid-state image pickup device in the example of the present embodiment having the above configuration, a signal charge generated in the light receiving section 2 is read out and transferred in the vertical direction by a driving method similar to that of the sixth embodiment. The solid-state image pickup device in the example of the present embodiment can provide similar effects to those of the first embodiment and the tenth embodiment.

The foregoing first to eleventh embodiments have been described by taking as an example a case where the present invention is applied to a CCD type solid-state image pickup device formed by arranging unit pixels generating a signal charge according to an amount of incident light in the form of a matrix. However, the present invention is not limited to application to CCD type solid-state image pickup devices, but is also applicable to CMOS type solid-state image pickup devices, for example.

In particular, in a CMOS type solid-state image pickup device having a global shutter function of which simultaneity is demanded, a storage capacitor section for temporarily storing a signal charge generated in a light receiving section is formed between the light receiving section and a floating diffusion section for reading out the signal charge. Such a floating diffusion section and such a storage capacitor section correspond to a charge transfer path in the present invention, and are desirably shielded from light. In such a structure, a light shielding film for shielding a readout electrode, a gate electrode (corresponding to a transfer electrode in the present invention) forming another pixel transistor, a storage capacitor section and the like from light is formed by using a material having a light shielding property in one time of patterning. Thereby, positional relation between the light shielding film and the gate electrode forming the pixel transistor can be formed accurately. Thus readout voltage can be made constant. In addition, the region of a light receiving section can be expanded by forming each gate electrode of a material having a light shielding property.

In addition, the present invention is not only applicable to solid-state image pickup devices sensing a distribution of an amount of incident visible light and imaging the distribution as an image but also applicable to solid-state image pickup devices imaging a distribution of an amount of incident infrared rays, X-rays, particles or the like as an image. In addition, in a broad sense, the present invention is applicable to solid-state image pickup devices in general such as a fingerprint detecting sensor and the like sensing a distribution of another physical quantity such as pressure, capacitance or the like and imaging the distribution as an image (physical quantity distribution sensing devices).

Further, the present invention is not limited to solid-state image pickup devices that scan each unit pixel in a pixel section in order in row units and which read out a pixel signal from each unit pixel. The present invention is applicable to an X-Y address type solid-state image pickup device that selects an arbitrary pixel in a pixel unit and which reads out a signal from the selected pixel in a pixel unit.

Incidentally, a solid-state image pickup device may be in a form formed as one chip, or may be in a modular form having an image pickup function in which form a pixel section and a signal processing section or an optical system are collectively packaged.

In addition, the present invention is not limited to application to solid-state image pickup devices, but is also applicable to image pickup devices. The image pickup devices in this case refer to camera systems such as digital still cameras, video cameras and the like as well as electronic apparatuses having an image pickup function such as portable telephones and the like. Incidentally, the above-described modular form incorporated into an electronic apparatus, that is, a camera module may be an image pickup device. An electronic apparatus according to an embodiment of the present invention will be described in the following.

12. Twelfth Embodiment

Electronic Apparatus

Figure 27:
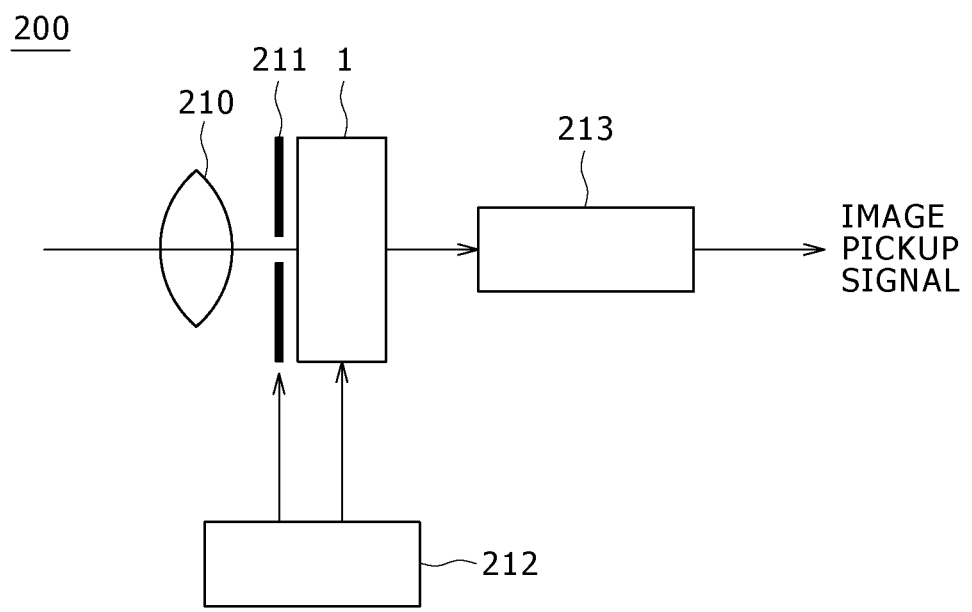
FIG. 27 is a schematic configuration diagram of an electronic apparatus according to a twelfth embodiment of the present invention.
Figure 28:
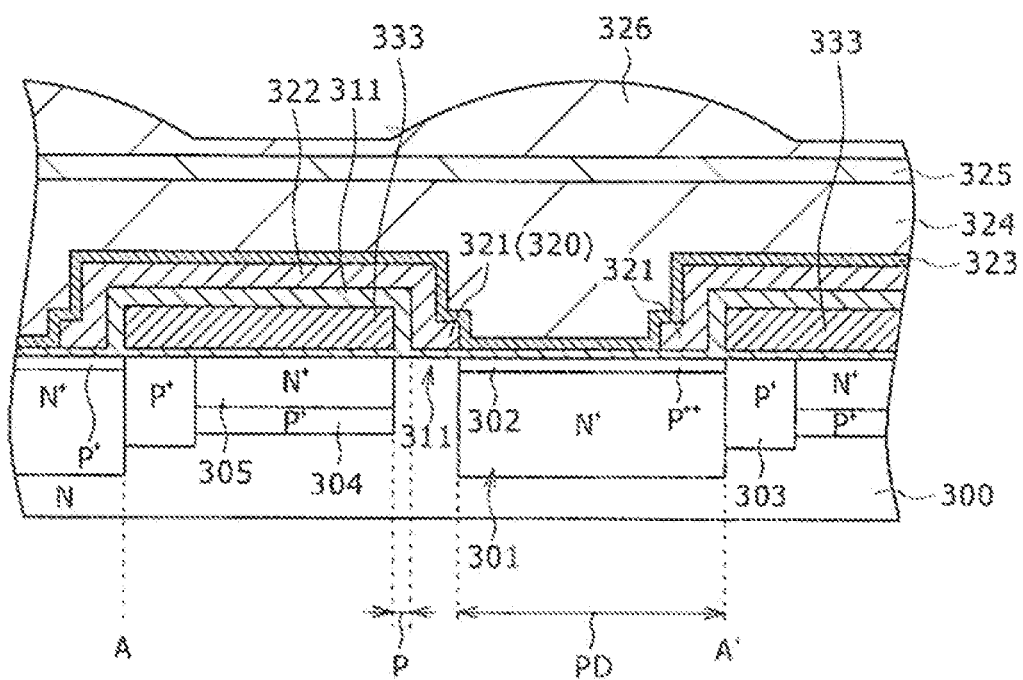
FIG. 28 is a schematic sectional configuration diagram of an existing solid-state image pickup device.

FIG. 27 is a schematic configuration diagram of an electronic apparatus 200 according to a twelfth embodiment of the present invention.

The electronic apparatus 200 according to the present embodiment illustrates an embodiment in which the solid-state image pickup device 1 according to the foregoing first embodiment of the present invention is used in an electronic apparatus (camera).

The electronic apparatus 200 according to the present embodiment includes the solid-state image pickup device 1, an optical lens 210, a shutter device 211, a driving circuit 212, and a signal processing circuit 213.

The optical lens 210 condenses image light (incident light) from a subject, and forms an image on the image pickup surface of the solid-state image pickup device 1. Thereby a relevant signal charge is accumulated in a certain period within the solid-state image pickup device 1.

The shutter device 211 controls a light irradiation period and a light shielding period for the solid-state image pickup device 1.

The driving circuit 212 supplies driving signals for controlling the transfer operation of the solid-state image pickup device 1 and the shutter operation of the shutter device 211. The solid-state image pickup device 1 performs signal transfer according to the driving signal (timing signal) supplied from the driving circuit 212. The signal processing circuit 213 performs various signal processing. A video signal resulting from the signal processing is stored on a storage medium such as a memory or the like, or output to a monitor.

In the solid-state image pickup device 1 of the electronic apparatus 200 according to the present embodiment, a region for forming a dark current suppressing region can be controlled with high precision, and defects such as a white spot and the like can be suppressed by suppressing the occurrence of a dark current without decreasing transfer efficiency. Thus, degradation in image quality is suppressed.

The electronic apparatus 200 to which the solid-state image pickup device 1 is thus applicable is not limited to a camera, but is applicable to image pickup devices such as digital still cameras as well as camera modules for mobile devices such as portable telephones and the like.

In the present embodiment, the solid-state image pickup device 1 is used in an electronic apparatus. However, solid-state image pickup devices formed according to the second to eleventh embodiments described above can also be used.

The present application contains subject matter related to that disclosed in Japanese Priority Patent Application JP 2009-223233 filed with the Japan Patent Office on Sep. 28, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device, comprising:
   a pixel, the pixel including:
      a light receiving section configured to generate and accumulate a signal charge corresponding to an amount of incident light, the light receiving section being formed on a light incidence side of a substrate;
      a charge transfer path configured to transfer the signal charge read out from said light receiving section, the charge transfer path being formed on one side of said light receiving section;
      a transfer electrode formed of a light shielding material above the substrate in which said charge transfer path is formed and configured to transfer the signal charge within said charge transfer path;
      a readout gate section configured to perform an operation of reading out the signal charge formed in said light receiving section, the readout gate section being formed between said light receiving section and said charge transfer path; and
      a readout electrode formed of a light shielding material above the substrate in which said readout gate section is formed and configured to make said readout gate section perform the readout operation, the readout electrode: (1) being formed independently of said transfer electrode in a same single layer as said transfer electrode, and (2) being connected to a wiring layer formed above said readout electrode via a contact part, the wiring layer formed so as to cover said readout electrode and said transfer electrode.

2. The solid-state image pickup device according to claim 1, wherein two or more said transfer electrodes are formed for said light receiving section, and a light shielding dedicated electrode is: (1) formed so as to cover a gap between said transfer electrodes, (2) formed in the same single layer as said transfer electrodes in a same patterning process as said transfer electrodes, and (3) formed on a side part of said transfer electrodes on an opposite side from a side on which said readout electrode is formed.

3. The solid-state image pickup device according to claim 2, wherein said light shielding dedicated electrode is formed by a projecting part formed by extending a part of said transfer electrode.

4. The solid-state image pickup device according to claim 2, wherein said light shielding dedicated electrode and said transfer electrode are formed independently of each other.

5. The solid-state image pickup device according to claim 4, wherein different voltages are applied to said readout electrode and said light shielding dedicated electrode.

6. The solid-state image pickup device according to claim 1, wherein one said transfer electrode is formed per pixel.

7. The solid-state image pickup device according to claim 6, wherein a plurality of said pixels are formed in a vertical direction and a horizontal direction within a two-dimensional plane, and said charge transfer path is shared by two pixels adjacent to each other in the horizontal direction.

8. The solid-state image pickup device according to claim 7, wherein said transfer electrode is shared by two pixels adjacent to each other in the vertical direction.

9. A method for manufacturing a solid-state image pickup device, said method, comprising the steps of:
   preparing a substrate;
   forming a light receiving section for generating and accumulating a signal charge corresponding to incident light and a charge transfer path for transferring the signal charge generated and accumulated in the light receiving section by performing ion implantation of a desired impurity into a desired region of said substrate;
   forming a readout electrode made of a light shielding material for reading out the signal charge of said light receiving section to said charge transfer path and a transfer electrode made of a light shielding material for transferring the signal charge read out to said charge transfer path independently of each other by one time of patterning in a desired region on said substrate before or after forming said light receiving section and said charge transfer path; and
   forming a wiring layer electrically connected to said readout electrode via a contact part over said readout electrode and said transfer electrode, the wiring layer covering said readout electrode and said transfer electrode.

10. The method for manufacturing the solid-state image pickup device according to claim 9, wherein two or more said transfer electrodes are formed for said light receiving section, and a light shielding dedicated electrode for covering a gap between said transfer electrodes from a side is formed in a same single layer as said transfer electrodes and in a same patterning process as said transfer electrodes on a side part of said transfer electrodes, said light shielding dedicated electrode being formed on an opposite side from a side on which said readout electrode is formed.

11. The method for manufacturing the solid-state image pickup device according to claim 10, wherein said light shielding dedicated electrode is formed by a projecting part formed by extending a part of said transfer electrode.

12. An electronic apparatus, comprising:

an optical lens;

a light receiving section configured to generate and accumulate a signal charge corresponding to an amount of incident light, the light receiving section being formed on a light incidence side of a substrate;

a solid-state image pickup device on which light condensed by said optical lens is made incident, the solid-state image pickup device including a pixel, the pixel including:

(1) a charge transfer path configured to transfer the signal charge read out from said light receiving section, the charge transfer path being formed on one side of said light receiving section, (2) a transfer electrode formed of a light shielding material above the substrate in which said charge transfer path is formed and configured to transfer the signal charge within said charge transfer path, (3) a readout gate section configured to perform an operation of reading out the signal charge formed in said light receiving section, the readout gate section being formed between said light receiving section and said charge transfer path, and (4) a readout electrode formed of a light shielding material above the substrate in which said readout gate section is formed and configured to make said readout gate section perform the readout operation, the readout electrode: (i) being formed independently of said transfer electrode in a same single layer as said transfer electrode, and (ii) being connected to a wiring layer formed above said readout electrode via a contact part, the wiring layer formed so as to cover said readout electrode and the said transfer electrode; and a signal processing circuit for processing an output signal output from said solid-state image pickup device.

* * * * *